US 11,985,887 B2
(12) United States Patent
Pun et al.

(10) Patent No.: US 11,985,887 B2
(45) Date of Patent: *May 14, 2024

(54) SYSTEMS AND METHODS FOR SUPPORTING AND CONVEYING A SUBSTRATE

(71) Applicant: KATEEVA, INC., Newark, CA (US)

(72) Inventors: Digby Pun, San Jose, CA (US); Cormac McKinley Wicklow, Newark, CA (US)

(73) Assignee: Kateeva, Inc., Newark, CA (US)

( * ) Notice: Subject to any disclaimer, the term of this patent is extended or adjusted under 35 U.S.C. 154(b) by 65 days.

This patent is subject to a terminal disclaimer.

(21) Appl. No.: 17/647,410

(22) Filed: Jan. 7, 2022

(65) Prior Publication Data
US 2022/0181596 A1 Jun. 9, 2022

Related U.S. Application Data

(62) Division of application No. 16/593,203, filed on Oct. 4, 2019, now Pat. No. 11,251,411.

(Continued)

(51) Int. Cl.
*H10K 71/00* (2023.01)
*B05C 13/00* (2006.01)
*H10K 71/13* (2023.01)

(52) U.S. Cl.
CPC ............ *H10K 71/00* (2023.02); *B05C 13/00* (2013.01); *H10K 71/13* (2023.02)

(58) Field of Classification Search
CPC ... B05C 13/00; H01L 51/56; H01L 27/14603; H01L 27/1464; H01L 27/14643; B41L 21/02
See application file for complete search history.

(56) References Cited

U.S. PATENT DOCUMENTS 11,251,411 B2 * 2/2022 Pun .................. H10K 71/00
2007/0160454 A1 * 7/2007 Iida ...................... B65G 49/065
156/345.31

(Continued)

FOREIGN PATENT DOCUMENTS

CN 1608961 A 4/2005
CN 1996567 B 8/2010

(Continued)

OTHER PUBLICATIONS

First Office Action dated Jun. 2, 2022 for CN Patent Application No. 201980066654.5.

(Continued)

*Primary Examiner* — Tuan A Hoang
(74) *Attorney, Agent, or Firm* — Hauptman Ham, LLP

(57) ABSTRACT

A system may include a support surface for supporting a substrate, a plurality of first passages arranged to distribute flows of a first gas to establish a gas bearing to float the substrate above the support surface, and a plurality of second passages arranged to distribute flows of a second gas to convey the substrate along the support surface. A method may include floating a substrate above a support surface of a substrate support apparatus via a gas bearing; and while floating the substrate, conveying the substrate along the support surface by flowing gas toward a surface of the substrate and in a nonperpendicular direction relative to the surface of the substrate.

20 Claims, 23 Drawing Sheets

Related U.S. Application Data

(60) Provisional application No. 62/768,838, filed on Nov. 16, 2018, provisional application No. 62/743,900, filed on Oct. 10, 2018.

(56) References Cited

U.S. PATENT DOCUMENTS

| | | | |
|---|---|---|---|
| 2009/0291209 A1 | 11/2009 | Granneman et al. | |
| 2013/0206058 A1* | 8/2013 | Mauck | H10K 71/00 118/300 |
| 2015/0259786 A1* | 9/2015 | Ko | H01L 21/6719 118/620 |
| 2015/0360462 A1* | 12/2015 | Lowrance | B41J 11/22 101/425 |
| 2016/0016423 A1* | 1/2016 | Mauck | B01D 46/0039 347/110 |

FOREIGN PATENT DOCUMENTS

| | | |
|---|---|---|
| CN | 102060193 A | 5/2011 |
| CN | 102470998 A | 5/2012 |
| CN | 104813460 A | 7/2015 |
| CN | 106973516 A | 7/2017 |
| JP | S57128940 A | 8/1982 |
| TW | 200839028 A | 10/2008 |

OTHER PUBLICATIONS

International Search Report dated Dec. 11, 2019 to PCT Patent Application No. PCT/US19/054825.
Non-Final Office Action dated Jul. 7, 2021 for U.S. Appl. No. 16/593,203.
Notice of Allowance dated Oct. 14, 2021 for U.S. Appl. No. 16/593,203.
Restriction Requirement dated Apr. 23, 2021 for U.S. Appl. No. 16/593,203.

* cited by examiner

SYSTEMS AND METHODS FOR SUPPORTING AND CONVEYING A SUBSTRATE

REFERENCE TO RELATED APPLICATIONS

This application is a division of U.S. patent application Ser. No. 16/593,203, filed Oct. 4, 2019, which claims priority to U.S. Provisional Application No. 62/768,838, filed, Nov. 16, 2018, and to U.S. Provisional Application No. 62/743,900, filed Oct. 10, 2018, each of which is incorporated by reference in its their entirety herein.

TECHNICAL FIELD

The present disclosure generally relates to devices, systems, and methods for supporting and conveying a substrate during fabrication of a layer on the substrate, such as for example, in the manufacture of electronic display devices.

INTRODUCTION

Electronic devices, such as optoelectronic devices, can be fabricated using various thin-film deposition and processing techniques in which one or more layers of materials are deposited onto a substrate, which can be a sacrificial substrate or form part of a final device. Examples of such devices include, but are not limited to, microchips, printed circuit boards, solar cells, electronic displays (such as liquid crystal displays, organic light emitting diode displays, and quantum dot electroluminescent displays), or other devices. Applications for electronic display devices also can include general illumination, use as a backlight illumination source, or use as a pixel light source. One class of organic optoelectronic devices includes organic light emitting diode (OLED) devices, which can generate light using electroluminescent emissive organic materials such as small molecules, polymers, fluorescent, or phosphorescent materials.

The manufacture of organic light emitting devices (OLEDs) generally involves depositing one or more organic materials on a substrate to form a stack of thin films, and coupling the top and bottom of the stack of thin films to electrodes. Various techniques can be used to form the stack of thin films. In a thermal evaporation technique, organic material may be vaporized in a relative vacuum environment and subsequently condensed on the substrate. Another technique for forming the stack of thin films involves dissolution of the organic material into a solvent, coating the substrate with the resulting solution, and subsequent removal of the solvent. An ink jet or thermal jet printing system may be used for deposition of organic material dissolved in a solvent.

Because materials used in electronic device manufacturing, such as, for example, organic materials used in OLED devices, also may be highly sensitive to exposure to various ambient materials, such as oxygen, ozone, water and/or other vapor, the entire system for substrate printing may be housed in an enclosure, in which a low-particle, non-reactive atmosphere may be maintained using one or more inert gases and a gas circulation and filtration system that removes particles generated by the printing system from the interior of the enclosure.

Particulate contamination, as well as contact from other system components with the substrate or the layers deposited on the substrate during processing, can also affect the quality of various electronic devices, including OLED devices. Various methods may be used to support a substrate during the fabrication process of the OLED device. For example, the substrate may be supported by a mechanical platform (e.g., chuck) that employs vacuum or mechanical clamping to hold the substrate in place during processing. Lift pins may be used to support center regions of the substrate, for example, to raise or lower the substrate with respect to the chuck so as to facilitate loading and unloading. In the case of vacuum chucks, vacuum holes or grooves in portions of the chuck over which center regions of the substrates are positioned may be used to hold the substrate down in place. Such holes or grooves may cause non-uniformities (or "mura") in the organic material deposited onto the substrate. In addition, physical contact with the substrate at active regions on which organic materials are deposited may also cause the mura phenomenon.

Generally, if active regions of a substrate are not supported continuously and uniformly (e.g., with a uniform application of force) during or after the printing process, non-uniformities or visible defects may exist in the organic material deposited onto the substrate. Various specialized uniform support techniques can be used to achieve uniform, substantially defect-free coatings. For example, non-uniform or physical support may be provided at non-active regions of the substrate, such as the peripheral areas of the substrate that will not form part of the active electronics and emissive portions of the display (e.g., peripheral regions where organic material is not deposited in OLED devices). Additionally, non-contact supporting of the substrate may be used to support the substrate during printing, conveyance, and/or thermal treatment processes. Such non-contact supporting can be achieved using a floatation system that uses gas bearings to float (lift) the substrate above the surface of a floatation table. In an implementation of a floatation table, a combination of passages emitting pressurized gas and suction passages drawing in gas (e.g., vacuum) are used to create a tightly controlled fluidic spring gas bearing. The pressurized gas outlet passages provide the lubricity and non-contacting floatation support for the substrate, while the suction passages support the counter-force necessary to strictly control the height at which the relatively light-weight substrate floats. In another implementation, the floatation table can use passages emitting only the pressurized gas without suction passages. Such floatation systems can use various gases, including but not limited to, for example, nitrogen or other inert gases, or air.

While floatation system designs allow for controlled vertical (z-direction) movement of a substrate normal to a plane of the surface of the floatation table, lateral motion (in the x- or y-direction parallel to a plane of the surface of the floatation table) of the substrate using a non-contact mechanism is desirable. Moreover, it may be desirable to provide a floatation table that permits various sizes and shapes of substrates to be supported in desired lateral (x-y) positioning relative to the surface of the floatation table without having to contact the edge of the substrate, which can pose alignment problems with substrates of differing sizes are being processed.

In some floatation systems in which motorized bankers (e.g., a device with a swing arm) are used to push the substrate into a desired position for a gripper system to grip, particulate matter generated by the motorized bankers may cause contamination to the substrate when the motorized bankers contact the substrate. This may cause the "mura" phenomenon on the substrate after the deposited material is deposited onto the substrate.

In addition, when motorized bankers are used, heat may be generated in the motorized bankers. When heat is injected into a local contact area on the substrate when the bankers push the substrate, the heat may cause distortion in the substrate. Moreover, the heat may cause expansion in the substrate, which can affect the accuracy of the deposition of the organic material onto the surface of the substrate.

SUMMARY

According to various exemplary embodiments, the present disclosure contemplates a system comprising a printing system comprising a printhead assembly arranged to dispense a material for deposition onto a substrate, a substrate support apparatus comprising a support surface, the substrate support apparatus comprising a plurality of first passages arranged to distribute flows of a first gas to establish a gas bearing to float the substrate above the support surface. The system also may comprise a conveyance system comprising a plurality of second passages arranged to distribute flows of a second gas to convey the substrate along the support surface.

According to other exemplary embodiments, the present disclosure contemplates a substrate support apparatus comprising a support surface, a plurality of first passages arranged in the support surface to distribute flows of a first gas to establish a gas bearing to float the substrate above the support surface, and a plurality of second passages arranged to distribute flows of a second gas to convey the substrate along the support surface.

In yet other exemplary embodiments, the present disclosure contemplates a method comprising floating a substrate above a support surface of a substrate support apparatus via a gas bearing; and while floating the substrate, conveying the substrate along the support surface by flowing gas from one or more passages in a nonperpendicular direction relative to the support surface.

In yet another exemplary embodiment, the present disclosure contemplates a substrate support apparatus comprising a surface, a means for floating the substrate above the surface, and means for creating a drag force on the substrate supported by the means for floating the substrate, the drag force having a directional component parallel to a surface of the substrate facing the surface of substrate support apparatus. In another exemplary embodiment, the present disclosure contemplates a method comprising floating a substrate above a surface of a substrate support apparatus, and creating a drag force on the substrate while floating the substrate, the drag force having a directional component parallel to a surface of the substrate facing the surface of the substrate support apparatus.

Additional objects, features, and/or other advantages will be set forth in part in the description which follows, and in part will be obvious from the description, or may be learned by practice of the present disclosure and/or claims. At least some of these objects and advantages may be realized and attained by the elements and combinations particularly pointed out in the appended claims.

Both the foregoing general description and the following detailed description are exemplary and explanatory only and are not restrictive of the claims; rather the claims should be entitled to their full breadth of scope, including equivalents.

BRIEF DESCRIPTION OF THE DRAWINGS

The present disclosure can be understood from the following detailed description, either alone or together with the accompanying drawings. The drawings are included to provide a further understanding of the present disclosure, and are incorporated in and constitute a part of this specification. The drawings illustrate one or more exemplary embodiments of the present teachings and together with the description explain certain principles and operation.

DETAILED DESCRIPTION OF EXEMPLARY EMBODIMENTS

Figure 1:
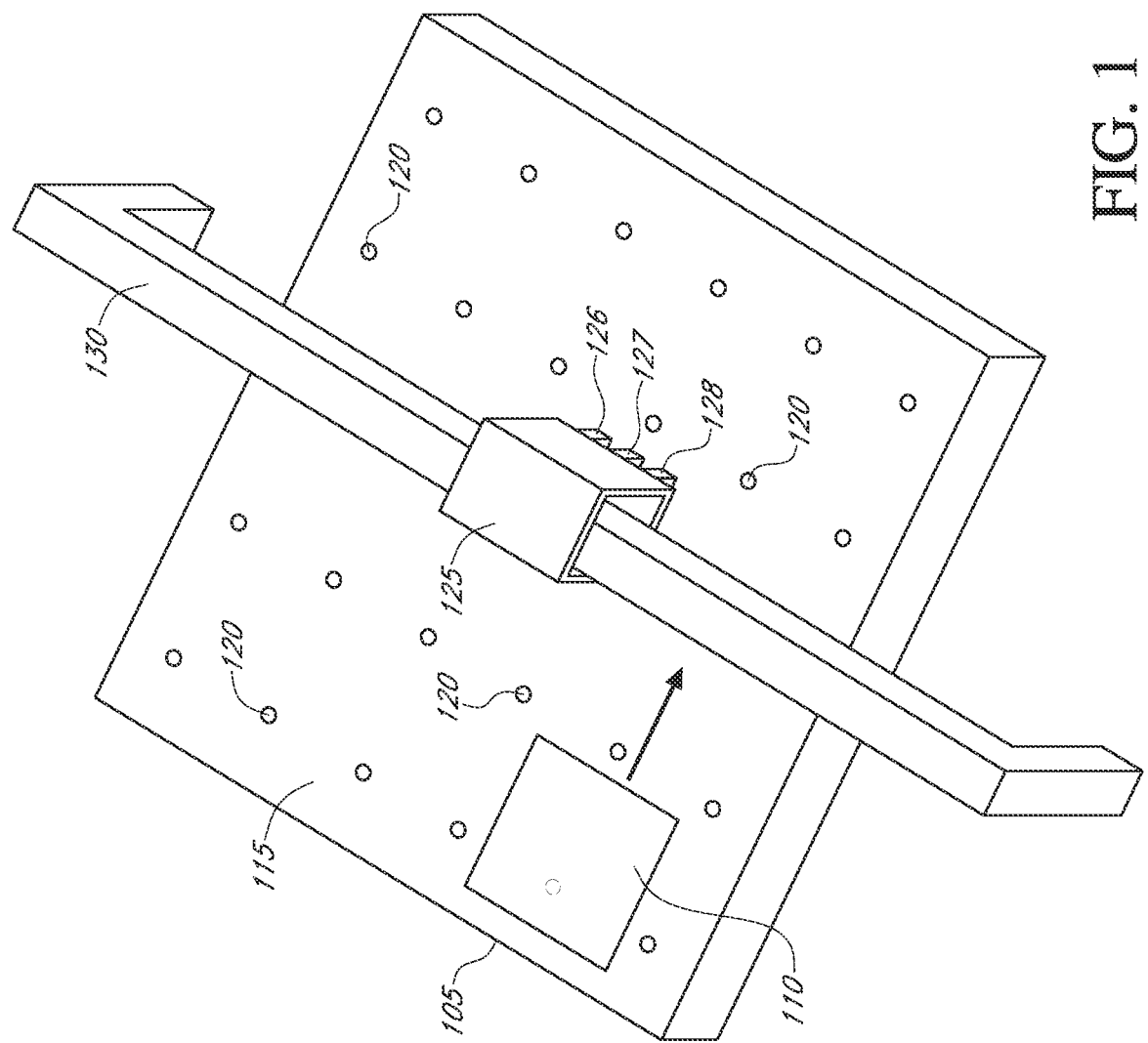
FIG. 1 schematically illustrates a perspective view of various printing system components for electronic device manufacture in accordance with an exemplary embodiment of the present disclosure.

Exemplary embodiments described herein include systems, methods, and devices for supporting and conveying (e.g., translating) a substrate during fabrication of any of a variety of electronic devices, such as, for example, OLED display devices. Exemplary disclosed systems and methods may include various forms of air (or gas) bankers that can provide a flow of gas at an angle relative to a surface (e.g., a surface of a floatation table), so as to convey a substrate laterally relative to a surface of the floatation table over which the substrate is supported. By angling the flow of gas relative to the surface, drag forces created by the flow between the support surface of substrate support apparatus (e.g., a floatation table) and a lower surface (i.e., surface facing the support surface) of the substrate causes conveyance of the substrate laterally relative to the support surface. That is, drag forces can be generated by a flow of gas (other than a gas that may be used to float and support the substrate at a desired floating height) such that a draft force component acts generally parallel to the planar surface of the substrate (e.g., the surface resting on a gas cushion used to float the substrate). For discussion purposes, the disclosed systems are referred to as systems for fabricating OLED devices. However, one of ordinary skill in the art would understand that the disclosed systems and methods may be used for other purposes, including fabrication of other devices (such as other electronic devices using substrate deposition techniques), processing of other materials (other than the organic material disclosed herein), or processing of substrates for other purposes (e.g., cleaning, thermal treating, etc.). For example, the disclosed systems and methods may be used in handling any substrate, including flat panel, glass, plastic sheet, polychlorinated biphenyl (PCB) or wood veneer.

While the term "air" banking or "air" bankers is used throughout the description, such terminology is not intended to limit the gas supplied to such mechanisms to air. Rather, it is contemplated that any type of gas may be used, including, but not limited to, for example, air, nitrogen, any of the noble gases, and combinations thereof. Moreover, in various exemplary embodiments that have a flow of a first gas to provide floatation support of a substrate and a flow of a second gas to provide conveyance (e.g., via the drag force discussed above) of the substrate, the first and second gas may be the same as or differ from each other Various exemplary embodiments disclosed herein also provide enhanced flexibility to provide customized supporting and/or conveyance of a substrate. For example, in some exemplary embodiments, direction of and amount of gas flowing from various outlets of a substrate support apparatus may be controlled to achieve highly flexible support and conveyance of substrates, including the ability to support and convey various substrate sizes, shapes, and orientations, thereby enhancing overall substrate fabrication processes. Moreover, the use of air bankers according to various exemplary embodiments can eliminate or minimize contact of substrates with other mechanical banking components, which can reduce particulate generation, reduce the risk of damage of the substrate due to contact, and/or reduce wear of mechanical parts arising from contact with the substrate and other wear associated with mechanical parts, thereby also reducing servicing of such parts.

Various exemplary embodiments also provide flexibility over a range of glass sizes that can be accommodated and processed because of the flexibility in positioning and use of nozzles or ports associated with air bankers as opposed to other mechanical components requiring contact with a substrate, which may not be arranged or positioned at locations that can accommodate substrates of varying sizes. In this way, the same air banking equipment can be used to handle various sized substrates without affecting the banking/conveyance capabilities. In display manufacturing, substrate sizes are often referred to in terms of generations as Gen n, n representing a different number and with each generational size roughly corresponding to the overall substrate size that is processed to, of which multiple smaller displays may ultimately be made. Exemplary non-limiting large size substrates of higher generations may be on the order of 1500 mm×1850 mm, or 2200 mm×2500 mm, or 2940 mm×3370 mm, however larger sized substrates and smaller sized substrates of hundreds of millimeters by hundreds of millimeters also are contemplated as within the scope of the present disclosure. The present disclosure embodiments can accommodate any of the generational sizes, and is not limited in this regard. However, those having ordinary skill in the art would appreciate that the surface area and drag forces should be considered when determining how any particular generation size can be handled using air banking techniques according to exemplary embodiments of the present disclosure.

FIG. 1 schematically illustrates an exemplary system 100 that may be used for depositing material on a substrate during a manufacturing process, such as the manufacture of various electronic devices, including but not limited to OLED devices. Although not shown in FIG. 1, those having ordinary skill in the art would appreciate that system 100 can include various other components and may be a subsystem that is part of a larger overall fabrication system. By way of example, system 100 may include or be operably coupled to a thermal treatment system or section having one or more thermal treatment devices (e.g., heaters, coolers, UV treatment devices, etc.) for treating materials before and/or after the materials are deposited onto the substrates using various technologies. Similarly, system 100 may include or be operably coupled to one or more cooling sections or zones including one or more cooling devices for reducing the temperature of substrates. System 100 may include or be operatively coupled to one or more holding sections or zones having structures (such as stacked shelves) configured to hold substrates before or after the materials are deposited onto the substrates.

In some embodiments, system 100 is in an enclosure (not shown). The enclosure may be hermetically sealed. An environment in the enclosure may be maintained as a low-particle and/or non-reactive environment. For example, system 100 may include a gas circulation and filtration system configured to circulate an inert gas in the enclosure. The inert gas may be non-reactive with the organic material deposited on the substrate. The gas circulation and filtration system may include at least a portion disposed in the enclosure, and at least another portion disposed outside of the enclosure. The gas circulation and filtration system may remove particles, water vapor, oxygen, and ozone content from the environment in the enclosure, such that the particles, water vapor, oxygen, and ozone content, if present, may be maintained below specified limits, such as 100 ppm, 50 ppm, 10 ppm, etc. Non-limiting examples of such industrial systems for manufacture of electronic device components, including for printing of displays in various gas enclosures that may use floatation tables, are disclosed in U.S. Patent Application Publication Nos. US 2014/0311405 A1, US 2018/0014411 A1, and U.S. Pat. No. 9,505,245, the entirety of each of which is incorporated by reference herein.

System 100 may include a substrate support apparatus 105 for supporting and/or conveying (e.g., translating and/or rotating) the substrate. In various exemplary embodiments, the substrate support apparatus is a floatation table 105. Floatation table 105 may be configured to support a substrate in a non-contact manner by establishing a gas bearing to float the substrate at any suitable stage during processing of the substrate in the system 100. In addition to floating the substrates, floatation table 105 may also be configured to perform other functions, such as conveying (e.g., translating in x- and/or y-directions and/or rotating around a z-axis) substrates relative to the floatation table, for example between various sections of system 100. System 100 may include a conveyance system. The conveyance system may include various passages arranged in floatation table 105 or other places of system 100 to distribute flows of a gas to convey (e.g., translate and/or rotate) the substrate along floatation table 105.

Floatation table 105 may be a single-piece plate having a predetermined thickness, as shown in FIG. 1. Alternatively, floatation table 105 may include multiple segments that are separate from one another, as shown and described below with reference to FIGS. 20-21. The plate may be made of aluminum, ceramic, steel, a combination thereof, or any other suitable materials. Floatation table 105 may be supported on a supporting frame or structure for example relative to a ground surface, which is not shown in FIG. 1.

The floatation table 105 includes a plurality of passages 120 comprising openings to flow gas from a surface of the floatation table. The term "passage" as used herein is to be interpreted broadly and can include any of a variety of structures to direct a flow of gas, such as, but not limited to, ports, apertures, openings, throughholes, channels, nozzles, pores, or any combination thereof that permits gas flow in any direction therethrough. In some exemplary embodiments, a passage comprises an opening formed in a surface of a floatation table, a channel that includes the opening, a nozzle or, a combination of the nozzle disposed in the channel or opening, or one or more pores of a sintered or porous material that the floatation table may be made from. Passages can thus have various configurations in accordance with various embodiments disclosed herein, and can be integral with, disposed on, or disposed in a floatation table or other surface. A passage can also be in the form of a single slot, such as between two surfaces or formed in a surface. The slot may be provided with one or more vanes to direct flow of gas as desired, as one of ordinary skill in the art would understand. Persons of ordinary skill in the art will understand a variety of passage configurations that can be used to flow gas upon consideration of the present disclosure and embodiments, which are non-limiting. Openings may extend, for example via a channel, into a thickness of floatation table 105 and open at the top, support surface 115 of floatation table 105. In some embodiments, the channels may be blind or may be throughholes in floatation table 105 extending through a top support surface 115 and a bottom surface of the table opposite support surface 115. In other embodiments, passages comprising openings may be generally planar openings with minimal height dimension. Passages may have the same or different sizes. For example, with reference to FIG. 2, the first plurality of passages 120 may have a first size (e.g., a first diameter), and the second plurality of passages 120 may have a second size (e.g., a second diameter), which may be different from the first size. The passages 120 may have the same or different shapes. In some embodiments, a first plurality of passages 120 have a first shape, such as circular, for example in cross-section, and a second plurality of passages 120 have a second shape, such as oval in cross-section, different from the first shape. In some embodiments, passages 120 may have different configurations and/or orientations. For example, a first plurality of passages 120 may be oriented such that a first gas flowing out of first passages may be substantially normal or perpendicular to surface 115, and a second plurality of passages 120 may be oriented such that a second gas flowing out of second passages may be in a direction forming a nonperpendicular angle with respect to surface 115 of floatation table 105.

Passages 120 may be arranged to provide various functions. For example, a plurality of first passages 120 may be arranged to flow a first gas to form a gas cushion or a gas bearing for floating substrate 110 over surface 115. A plurality of second passages 120 may be arranged to flow a second gas so as to create a drag force on the substrate to convey (e.g., translate or rotate) substrate 110 relative to surface 115. The first gas and the second gas may be supplied from a same gas source, or from different gas sources, to the first and second passages. In some embodiments, the first passages for flowing the first gas and the second passages for flowing the second gas may have the same size, shape, and/or orientation. In some embodiments, the first passages for flowing the first gas and the second passages for flowing the second gas may have different sizes, different shapes, and/or different orientations. Although first passages and second passages are referred to in plural forms, it is possible that in some embodiments, a single first opening may be used to flow the first gas to float substrate 110, or a single second opening may be used to flow the second gas to convey (e.g., translate) substrate 110.

Moreover, although the above description sets forth passages of two differing configurations (e.g., size, shape, direction of gas flow, etc.), persons of ordinary skill in the art would appreciate that any number of differing configurations can be employed with any number of passages or groups of passages having such respective differing configurations.

The first passages for flowing the first gas to float substrate 110 and the second passages for flowing the second gas to convey (e.g., translate and/or rotate) substrate 110 may be arranged on floatation table 105 in various configurations. For example, the first and the second passages may be arranged alternately in adjacent rows, or alternately in adjacent columns. As another example, each row or column of passages may include a mixture of the first passages and the second passages. In some embodiments, the first passages may form a pattern on floatation table 105, and the second passages may form a different pattern on floatation table 105. In some embodiments, all of the passages 120 may be the same, and these passages may be dynamically selected to serve as the first passages or second passages based on requirements of system 100. Although not shown in FIG. 1, the second passages for flowing the second gas to convey (e.g., translate) substrate 110 may be arranged between rows or columns of the first passages for flowing the first gas to float substrate 110.

The first passages may be configured to direct flows of a first gas in a direction that may be substantially normal or perpendicular to surface 115 (and thus generally perpendicular to a surface of the substrate being floated by the flows of gas from the first passages). The first gas flowing out of the first passages may form a gas bearing between a lower surface of substrate 110 and surface 115 of floatation table 105. The gas bearing may be sufficient to floatingly support (i.e., float) substrate 110 over or above surface 115 of floatation table 105 at a fly height, which is measured in the z-direction (normal to the surface 115 of the table). The x-y-z Cartesian coordinate system as used herein is reflected in the orientation of the drawings, with it being understood that the x- and y-directions could be switched. The flows of the first gas may have a first pressure and a first flow rate, which may be controlled by a flow control system discussed below. The flow control system, which in exemplary embodiments may include a pressure regulator, may control at least one of the first pressure and first flow rate to control the fly height of substrate 110.

Floatation table 105 may be arranged to convey (e.g., translate and/or rotate) substrate 110 while substrate 110 is floated by the gas bearing over surface 115 of floatation table 105. In some embodiments, substrate 110 may be translated from one section or zone of system 100 to another section or zone using flows of the second gas provided from the second passages. In some embodiments, substrate 110 may be translated from one region of floatation table 105 to another region. In some embodiments, substrate 110 may be rotated (around the z-axis) by the flows of the second gas from the second passages of floatation table 105. Floatation table 105 may be arranged to rotate substrate 110 when substrate 110 is not translated or while substrate 110 is translated. The detailed arrangements of floatation table 105 for conveying substrate 110 are discussed below. Although translation is used as an example of the conveyance of the substrate in the below discussion, it is understood that the disclosed system may also be used to rotate the substrate while the substrate is floated or while the substrate is floated and translated along surface 115 of floatation table 105. For example, the rotational orientation of one or more nozzles disposed in openings may be adjusted to change the travel direction of substrate 110 (e.g., by changing the direction of the gas flow from the one or more nozzles along the plane of surface 115), which may cause substrate 110 to rotate.

Referring again to FIG. 1, system 100 includes a printhead assembly 125. Printhead assembly 125 may be mounted on a bridge 130, and may be movable along the bridge 130. For discussion purposes, printhead assembly 125 can include an inkjet printhead to deposit a material (such as an organic material) in a pattern on a surface of the substrate using inkjet printing technology. For example, in the embodiment shown in FIG. 1, printhead assembly 125 includes a plurality of printheads 126, 127, and 128. Each of printheads 126, 127, and 128 may be configured to deposit a material, such as an organic material, onto substrate 110 so as to form one or more layers on substrate 110. The material may be included in an ink. System 100 may include a treatment system having, for example, one or more thermal treatment devices (such as heaters and coolers) to treat the organic material deposited on the substrate to form layers. As discussed above, in various exemplary embodiments, layers formed on substrate 110 may be part of an OLED device.

While FIG. 1 and various exemplary embodiments described herein refer to deposition of materials on a substrate using inkjet printing techniques, those having ordinary skill in the art would understand that such a deposition technique is exemplary only and nonlimiting. Other material deposition techniques, such as, for example, vapor deposition, thermal jet deposition, etc., also may be used with the floatation and conveyance mechanisms of the present disclosure and are considered as within the scope of the present disclosure.

Bridge 130 may be disposed over floatation table 105, for example, across a width of floatation table 105 at a middle section of floatation table 105. Printhead assembly 125 is movable along bridge 130 over floatation table 105, e.g., in the x-direction. Substrate 110 may be moved along floatation table 105 and positioned under bridge 130 and printhead assembly 125. Printhead assembly 125 may deposit the organic material onto an upper surface of substrate 110 to form thin layers that are parts of an OLED device to be fabricated. In some embodiments, printhead assembly 125 may be positioned below substrate 110. For example, printheads may be embedded in or on surface 115 of floatation table 105, and may deposit the organic material onto a lower surface of substrate 110 from below the lower surface of substrate 110.

Floatation table 105 may be configured to convey (e.g., translate and/or rotate) substrate 110, using the second passages and flows of the second gas through the second passages, so as to position substrate 110 relative to the surface 115 of the floatation table 105, and thus relative to the printhead assembly 125. Floatation table 105 may also convey (e.g., translate), using the second passages and the flows of the second gas, substrate 110 through various sections in system 100, such as a treatment section, a holding section, a cooling section, etc. Alternatively or additionally, after substrate 110 is conveyed (e.g., translated) to a predetermined location on the floatation table 105, substrate 110 may be gripped mechanically by a gripper system. The gripper system may further convey (e.g., translate) substrate 110 relative to the surface of the floatation table 105 so as to position substrate 110 relative to printhead assembly 125, which is further discussed below.

Figure 2:
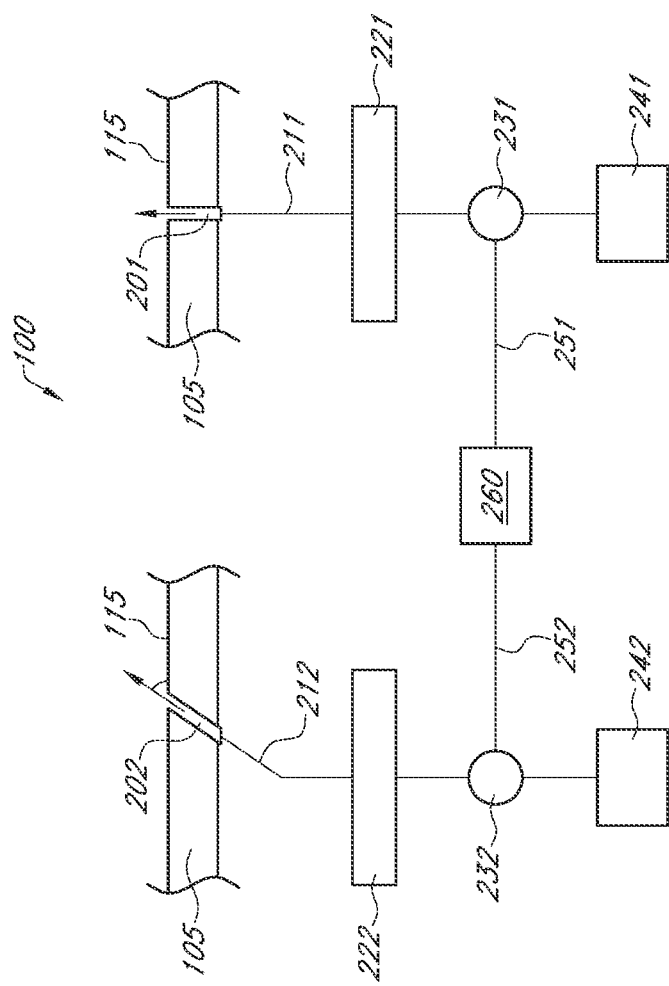
FIG. 2 schematically illustrates a partial side, cross-sectional view of an exemplary embodiment of a floatation table for supporting and conveying a substrate in accordance with the present disclosure.

FIG. 2 schematically illustrates an exemplary embodiment of components of a system 100 as shown and described in FIG. 1. FIG. 2 shows exemplary passages for floating and conveying (e.g., translating) substrates, and connections of the passages to other components of system 100. The passages shown in the embodiment of FIG. 2 comprise openings included as part of the floatation table 105. As discussed above, a plurality of first passages of passages 120 may be arranged to flow the first gas to form a gas bearing between surface 115 and a lower surface of substrate 110 to float substrate 110. A plurality of second passages of passages 120 may be arranged to flow the second gas to convey (e.g., translate) the substrate using a drag force created by the angled flow of the second gas relative to surface 115. First and second passages may have different sizes, shapes, and/or orientations. FIG. 2 shows an exemplary embodiment of a first passage 201 as an embodiment, and an exemplary second passage 202. For illustrative purposes, cross-sectional views of only one first passage 201 and only one second passage 202, along with portions of floatation table 105, are also shown in FIG. 2 to schematically show the configuration of system 100. It is understood that system 100 may include a plurality of first passages 201 and a plurality of second passages 202.

As discussed above, first passages 201 may be arranged to flow first gas substantially perpendicular to surface 115 of floatation table 105. FIG. 2 shows one embodiment of first passage 201 for providing the perpendicular flow of the first gas. In the embodiment shown in FIG. 2, first passage 201 may extend (e.g., as a blind channel or throughhole) into thickness of floatation table 105 and may open to the surface 115 so as to emit gas in a direction perpendicular to surface 115 of floatation table 105. It is understood that the entire length of the portion of the passage extending into the thickness of the floatation table 105 need not be perpendicular to surface 115 of floatation table 105. It is possible that in some embodiments, only an upper portion of the passage 201, including where it opens to the surface 115, is perpendicular to surface 115.

FIG. 2 also shows an embodiment of second passage 202 for providing an nonperpendicualr angled flow of the second gas relative to surface 115 of floatation table 105. In the embodiment shown in FIG. 2, second passage 202 also extends (e.g., as a blind channel or throughhole) into the thickness of the floatation table 105. The passage 202 extends at an angle through a thickness of the floatation table 105 such that an axis of where the passage 202 opens to the surface 115 of the floatation table 105 makes an acute angle α relative to surface 115. When the second gas flows out of the opening of the passage 202 from the surface, the flow of the second gas may be substantially in a direction that also forms the acute angle α with respect to surface 115 of floatation table 105.

In various exemplary embodiments, the acute angle α may range from about 0° to about 90°. For example, the acute angle α be in any of the following ranges: 0°<α<=10°, 10°<α<=20°, 20°<α<=30°, 30°<α<=40°, 40°<α<=50°, 50°<α<=60°, 60°<α<=70°, 70°<α<=80°, or 80°<α<90°. In some embodiments, the acute angle α is less than 5°, less than 10°, less than 15°, less than 20°, less than 30°, or less than 45°. In some embodiments, the acute angle α ranges from about 5° to about 30°. In some embodiments, the acute angle α ranges from about 30° to 45°. The acute angle α may be in a range between any two values selected from the range of 0° to 90°.

As with the first passage, the entire length of the second passage need not be at a nonperpendicular angle with respect to surface 115. It is possible that in some embodiments, only a portion of the length of the second passage extending from the opening at the surface 115 is angled with respect to surface 115, such that the second gas flows out from where the second passage 202 opens to the surface 115 in a direction forming the acute angle α with respect to surface 115 of floatation table 105.

Either or both of the first and second passages can also be provided by a conduit or other tube inserted into a throughole in the table 115.

In the embodiment of FIG. 2, each passage 201 and each second passage 202 included in floatation table 105 may be fluidically coupled to a flow control system. For example, first passage 201 can be operably (e.g., fluidically) coupled to a first gas supply manifold 221 through a first gas supply line 211. A plurality of first passages 201 may be operably coupled to first gas supply manifold 221 through individual first gas supply lines 211 to receive first gas from first gas supply manifold 221. For example, first gas supply manifold 221 may be operably (e.g., fluidically) coupled to a row or a column of first passages 201 to distribute the first gas to the rows or columns of first passages 201 at the same pressure and/or the same flow rate. In some embodiments, system 100 may include a single first gas supply manifold 221 coupled to all first passages 201. In some embodiments, system 100 may include a plurality of first gas supply manifolds 221 each coupled to differing ones or groups of the plurality of first passages 201.

In the embodiment shown in FIG. 2, second passage 202 may be operably (e.g., fluidically) coupled to a second gas supply manifold 222 through a second gas supply line 212. A plurality of second passage 202 may be operably (e.g., fluidically) coupled to second gas supply manifold 222 through individual second gas supply lines 212. For example, second gas supply manifold 222 may be operably (e.g., fluidically) coupled to a row or a column of second passages 202 to distribute the second gas to the rows or columns of second passages 202 at the same pressure and/or the same flow rate. In some embodiments, second gas supply manifold 222 may be operably (e.g., fluidically) coupled to a plurality of second passages distributed in floatation table 105 in a pattern other than a row or a column. In some embodiments, system 100 may include a single second gas supply manifold 222 coupled to all second passages 202. In some embodiments, system 100 may include a plurality of second gas supply manifolds 222 each coupled to differing ones or groups of the plurality of second passages 202.

In the embodiment shown in FIG. 2, first gas supply manifold 221 may be operably (e.g., fluidically) coupled to a first control valve 231 through a gas supply line. Second gas supply manifold 222 may be operably (e.g., fluidically) coupled to a second control valve 232 through a gas supply line. Each of first and second gas supply manifolds 221 and 222 may receive the first gas and the second gas from the first control valve 231 and the second control valve 232, respectively. The first and second control valves 231 and 232 may be operably (e.g., fluidically) coupled with a gas source 260 through gas supply lines 251 and 252, respectively. The gas source 260 may be a gas tank or a gas supply main line that may be configured to supply gas also to other components of system 100, such as various pneumatically operated actuators and devices. The gas source 260 may include or be coupled to a pressure regulator to adjust pressure of gas supplied to the gas supply lines 251 and 252 as desired. In the embodiment shown in FIG. 2, a single gas source 260 is used for supplying gas to both first passages 201 for floating substrate 110 and second passages 202 for conveying (e.g., translating) substrate 110. In some embodiments, more than one gas source may be used. For example, first passages 201 may receive a first gas from a first gas source, and second passages may receive a second gas from a separate second gas source.

First control valve 231 and second control valve 232 may be any suitable control valves. For example, first control valve 231 and second control valve 232 may be any power-operated valves. In some embodiments, first control valve 231 and second control valve 232 may be rotary control valves or linear control valves. In some embodiments, first control valve 231 and second control valve 232 may be solenoidal control valves. The number of first control valve 231 may be the same as the number of first gas supply manifold 221. The number of second control valve 232 may be the same as the number of second gas supply manifold 222.

Referring to FIG. 2, first control valve 231 may be operably (e.g., electrically) coupled to first controller 241. Second control valve 232 may be operably (e.g., electrically) coupled to second controller 242. Each of first and second controllers 241 and 242 may include suitable circuitry, gates, switches, logics, and other suitable software and hardware components. For example, each of first and second controllers 241 and 242 may include a processor having circuits and logics for processing signals and providing commands to other devices under control. Each of first and second controllers 241 and 242 may be configured or programmed to control first and second control valves 231 and 232, respectively, so as to control the pressure and/or the flow rate of the first gas supplied to first passage 201 and that of the second gas supplied to second passage 202, respectively. The pressures and/or flow rates of the first gas and second gas may be the same or may be different. Each of first and second controllers 241 and 242 may be configured to receive signals from each of first and second control valves 231 and 232. First and second controllers 241 and 242 may process the signals received from control valves 231 and 232, and may send signals to first and second control valves 231 and 232 to regulate the pressures and/or flow rates of the first and second gases supplied to the first and second passages 201 and 202, respectively. First and second controllers 241 and 242 may also receive signals from other components included in system 100, such as sensors, actuators, motors, gas source, pressure regulator etc. First and second controllers 241 and 242 may provide command signals to these components included in system 100 to control the operations thereof.

In the embodiment shown in FIG. 2, first and second controllers 241 and 242 are shown as separate controllers. In some embodiments, first and second controllers 241 and 242 may be the same controller, or may be parts of an integral controller. System 100 may include other components, such as memories, and other storage devices, including non-transitory computer-readable media, which may be used to store signals or data. First and second controllers 241 and 242 may be coupled with the memories and other storage devices, and may store signals or data in the memories and other storage devices. First and second controllers 241 and 242 may also retrieve signals or data from the memories and other storage devices and process the retrieved signals or data. Memories may also be used to store codes or programs configured to be executed by controllers 241 and 242 to perform various methods disclosed herein.

System 100 may include other components, such as sensors, actuators, motors, which may receive command signals from one or both of controllers 241 and 242, or may provide input signals to one or both of controllers 241 and 242. In addition to controlling first and second control valves 231 and 232, one or both of controllers 241 and 242 may be configured to control the other components, such as sensors, actuators, motors, etc., included in system 100 to perform other functions. In some embodiments, one or both of controllers 241 and 242 may be part of an overall system controller that controls the overall operations of system 100.

Referring to FIG. 2, first and second controllers 241 and 242 may control first control valve 231 and second control valve 232, respectively, to independently adjust the pressure and/or flow rate of the first and second gas supplied from gas source 260 to the plurality of first passages 201 and to the plurality of second passages 202. First controller 241 may control the pressure and/or flow rate of the first gas supplied from gas source 260 to first passage 201, such that the flows of the first gas from the plurality of first passages 201 are sufficient to float substrate 110. Second controller 242 may control the pressure and/or flow rate of the second gas supplied from gas source 260 to second passage 202, such that the flows of the second gas from the plurality of second passages 202 are sufficient to convey (e.g., translate) substrate 110 along floatation table 105, such as moving substrate 110 from one place of system 100 to another place of system 100 while substrate 110 is also floated by the gas bearing established by the first gas from first passages 201.

While FIG. 2 and various figures and embodiments below are described as controlling gas flow from the first and second plurality of passages outward and at a pressure, those having ordinary skill in the art would understand that the gas flows can also include suction (vacuum) and drawing gas into the various passages, in which case the gas sources and manifolds may be vacuum sources and/or vacuum sources can be separately fluidically coupled to the passages and fluid flow mechanisms. Further either or both of the first and second plurality of passages can include combinations of passages that supply pressurized gas flow outwardly from the surface 115 of the table 105 and passages that suction gas from above the surface 115 of the table 105 and into the passages.

Figure 3:
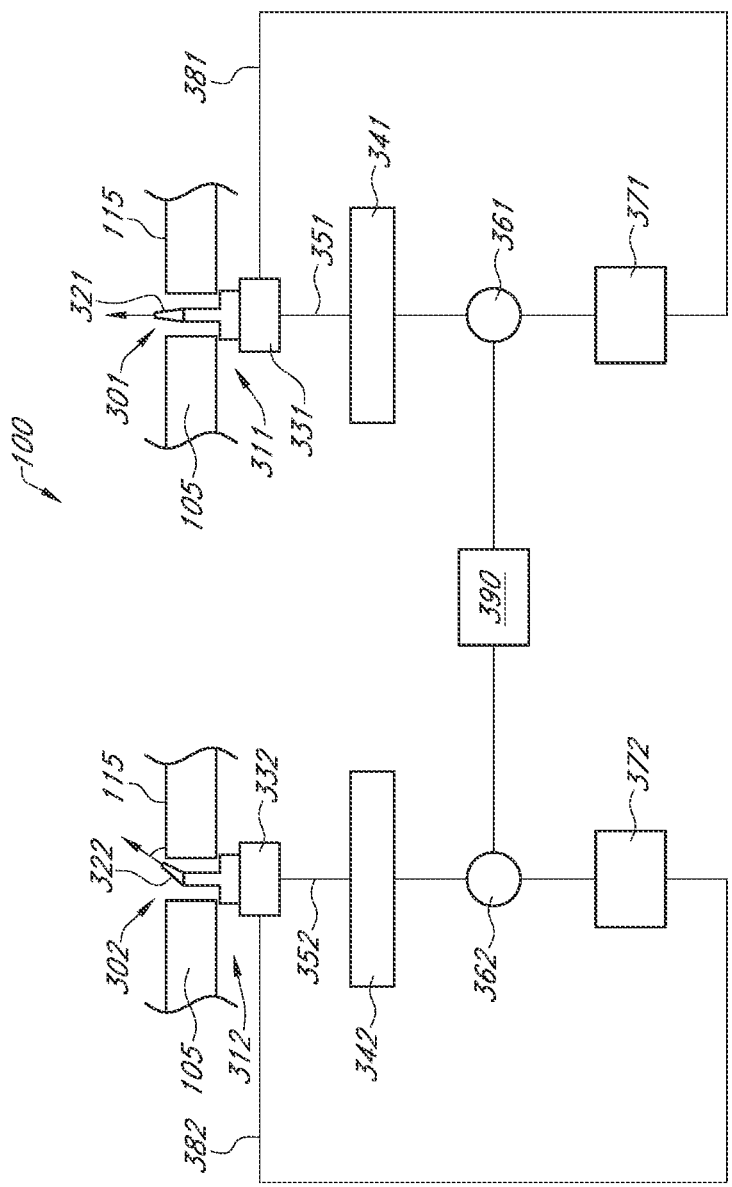
FIG. 3 schematically illustrates a partial side, cross-sectional view of yet another exemplary embodiment of a floatation table for supporting and conveying a substrate in accordance with the present disclosure.

FIG. 3 schematically illustrates another exemplary embodiment of components of a system 100 of FIG. 1. The arrangement of the table 105 and passages 301 and 302 in the exemplary embodiment of FIG. 3 includes nozzles at least partially disposed within the passages 301, 302 for providing gases to float and to convey (e.g., translate) substrates. FIG. 3 also shows connections of the nozzles to other components of system 100. As discussed above, the term "passage" as used herein may refer to the port of the nozzle, the opening or passage in which the nozzle is placed, and the combination thereof.

As shown in FIG. 3, floatation table 105 includes first and second passages 301 and 302 that can have a similar construction as the passages described with respect to the embodiment of FIG. 2. However, in the embodiment of FIG. 3, the first and second passages 301, 302 also are fitted with a nozzle at least partially disposed therein. The nozzles may provide flows of the first gas and second gas for floating and conveying (e.g., translating) substrate 110. For example, a first nozzle 311 may be at least partially disposed in the first passage 301. First nozzle 311 may include a first nozzle head 321 pointing in an upward direction such that the first gas flows out of first nozzle head 321 in a direction that is substantially perpendicular to surface 115 of floatation table 105. First nozzle head 321 may be disposed so as not to protrude out of the opening of the passage 301 beyond surface 115.

In some embodiments, first nozzle head 321 may be fixed to point in the upward direction, and may not be adjustable.

For example, first nozzle head 321 may not be pivotable with respect to surface 115 or may not be rotatable with respect to a central axis of first nozzle 311 that is normal to surface 115. In some embodiments, first nozzle head 321 may be adjustable. For example, first nozzle head 321 may be pivotable with respect to surface 115. First nozzle head 321 may also be rotatable with respect to the central axis of first nozzle 311, which may be normal to surface 115. When first nozzle head 321 is adjustable, and when first nozzle 311 is selected to provide a gas bearing to float substrate 110, first nozzle head 321 may be adjusted to the orientation shown in FIG. 3, i.e., pointing upward in a direction normal to surface 115, such that flows of first gas may be perpendicular to surface 115.

A second nozzle 312 may be disposed to flow gas from the second passage 302. Second nozzle 312 may include a second nozzle head 322 pointing in a nonperpendicular direction (forming an acute angle $\alpha$) with respect to surface 115 of floatation table 105. Second nozzle head 322 may be disposed so as not to protrude from the opening of the passage 302 beyond surface 115. The range of the acute angle $\alpha$ in the exemplary embodiment of FIG. 3 can be the same ranges as those discussed above with respect to the exemplary embodiment of FIG. 2.

In some embodiments, the acute angle $\alpha$ may be fixed. For example, second nozzle head 322 may be manually adjusted to the desired acute angle $\alpha$ when system 100 is set up, and may not be adjusted dynamically when first nozzle 312 is in operation. In other words, second nozzle head 322 may not be adjustable, and may be pre-manufactured to tilt at the acute angle $\alpha$. Further, in some embodiments, second nozzle head 322 may not be rotatable about a central axis of second nozzle 312. The orientation (e.g., the direction of the flow of gas relative to the plane of surface 115) of second nozzle head 322 may be manually turned to a desired direction (a direction that may affect the travel direction of substrate 110) before second nozzle 312 is placed in operation.

In some embodiments, the acute angle $\alpha$ may be dynamically adjustable during the fabrication process by adjusting the second nozzle head 322 based on the size and orientation of substrate 110 to be conveyed (e.g., translated), and other needs of system 100. The adjustment of second nozzle head 322 may be achieved automatically using motors and controllers, without requiring manual operations. Adjusting the acute angle $\alpha$ may affect the allocation of the magnitudes of the vertical lifting force (normal to surface 115) for floating substrate 110 and the horizontal drag force (parallel with surface 115) for conveying (e.g., translating) substrate 110, as provided by the flow of the second gas. Thus, depending on the dynamic needs of system 100 (e.g., more lifting force or more drag force), second nozzle head 322 may be adjusted to change the acute angle $\alpha$ to thereby affect the allocation of the vertical lifting force and the horizontal drag force of the flow of the second gas.

Referring to FIG. 3, first nozzle 311 may include or be operably coupled with a first motor 331 configured to rotate first nozzle head 321 about a central axis of first nozzle 311. First motor 331 may also be configured to pivot first nozzle head 321 with respect to surface 115 (e.g., to change the acute angle $\alpha$). First motor 331 may be any suitable motor, such as a brushed motor, a brushless motor, a direct drive motor, a linear motor, a servo moto, a stepper motor, etc. In some embodiments, first motor 331 may be omitted when first nozzle head 321 is not adjustable. For the purpose of discussion, first nozzle head 321 is considered as adjustable.

As in the embodiment of FIG. 2, the embodiment of FIG. 3 also includes a flow control system. First nozzle 311 may be operably (e.g., fluidically) coupled to a first gas supply manifold 341 through a first gas supply line 351. A plurality of first nozzles 311 may be coupled to first gas supply manifold 341 to receive first gas. For example, a row or a column of first nozzles 311 may be coupled to first gas supply manifold 341 through individual gas supply lines. First gas supply manifold 341 may be configured to distribute the first gas to a plurality of first nozzles 311 at the same pressure and/or the same flow rate. In some embodiments, system 100 may include a single first gas supply manifold 341 coupled to all first nozzles 311. In some embodiments, system 100 may include a plurality of first gas supply manifolds 341 each coupled to differing ones or a group of the plurality of first nozzles 311.

Second nozzle 312 may be operably (e.g., fluidically) coupled to a second gas supply manifold 342 through a second gas supply line 352. A plurality of second nozzles 312 may be coupled to second gas supply manifold 342 to receive second gas. For example, a row or a column of second nozzles 312 may be coupled to second gas supply manifold 342 through individual gas supply lines. Second gas supply manifold 342 may be configured to distribute the second gas to a plurality of second nozzles 312 at the same pressure and/or the same flow rate. In some embodiments, system 100 may include a single second gas supply manifold 342 coupled to all second nozzles 312. In some embodiments, system 100 may include a plurality of second gas supply manifolds 342 each coupled to differing ones or a group of the plurality of first nozzles 312.

First gas supply manifold 341 may be operably coupled to a first control valve 361 through a gas supply line. First control valve 361 may be similar to first control valve 231 discussed above and shown in FIG. 2. First control valve 361 may be operably (e.g., fluidically) coupled with a gas source 390 to receive a first gas from gas source 390. Gas source 390 may be similar to gas source 260 discussed above and shown in FIG. 2, including having or being coupled to a pressure regulator. Although a single gas source 390 is shown in the embodiment of FIG. 3, more than one gas source 390 may be included. For example, a first gas source may be included to supply a first gas to first nozzles 311 and a separate second gas source may be included to supply a second gas to second nozzles 312.

First control valve 361 may be operably coupled (e.g., electrically coupled) to a first controller 371. First controller 371 may be similar to first controller 241 discussed above and shown in FIG. 2. First controller 371 may be programmed or configured to control first control valve 361 to adjust the pressure and/or flow rate of the first gas supplied to first nozzle 311. That is, first controller 371 may adjust the pressure and/or flow rate of the flows of the first gas so as to affect the gas bearing that supports substrate 110.

First controller 371 may also be operably (e.g., electrically) coupled with first motor 331 through an electrical connection 381 to control the operations of first motor 331. For example, first controller 371 may control first motor 331 to rotate first nozzle head 321 with respect to a central axis of first nozzle 311, which may correspond to an axis normal to surface 115 of floatation table 105. First controller 371 may also be configured or programmed to control the pivoting angle (i.e., acute angle $\alpha$) of first nozzle head 321 with respect to surface 115. In some embodiments, first nozzle 311 may have a fixed nozzle head 321, which may not be adjustable in its orientation (e.g., rotation and/or pivoting), and first motor 331 may be omitted.

Referring to FIG. 3, second gas supply manifold 342 may be operably (e.g., fluidically) coupled to a second control valve 362 through a gas supply line. Second control valve 362 may be similar to first control valve 361 or any control valve disclosed herein. Second control valve 362 may be operably (e.g., fluidically) coupled to gas source 390 through a gas supply line to receive second gas from gas source 390. Second control valve 362 may be operably (e.g., electrically) coupled to a second controller 372 through an electrical connection.

Second controller 372 may be similar to first controller 371. Second nozzle 312 may include or be operably coupled to a second motor 332. Second motor 332 may be similar to first motor 331. Second motor 332 may be electrically coupled with second controller 372 through an electrical line 382. Second controller 372 may control second motor 332 to adjust the orientation of second nozzle head 322. The orientation of a nozzle head refers to the rotation angle of the nozzle head with respect to a central axis of the nozzle, and/or the pivoting angle of the nozzle head with respect to surface 115. The rotation and pivoting of the nozzle head are further illustrated and discussed below with reference to the embodiment of FIG. 6.

In some embodiments, second controller 372 may be configured or programmed to control second motor 332 to rotate second nozzle head 322 with respect to a central axis of second nozzle 312, which may correspond to an axis normal to surface 115 of floatation table 105. Second controller 372 may also be configured or programmed to control the pivoting (i.e., acute angle α) of second nozzle head 322 with respect to surface 115 of floatation table 105. Adjusting the pivoting of second nozzle head 322 may change a drag force created by the flows of the second gas for conveying (e.g., translating) substrate 110. In some embodiments, when second nozzle head 322 is not adjustable (e.g., not rotatable with respect to a central axis of second nozzle 312 and/or not pivotable to change the acute angle α), second motor 332 may be omitted.

Figure 20:
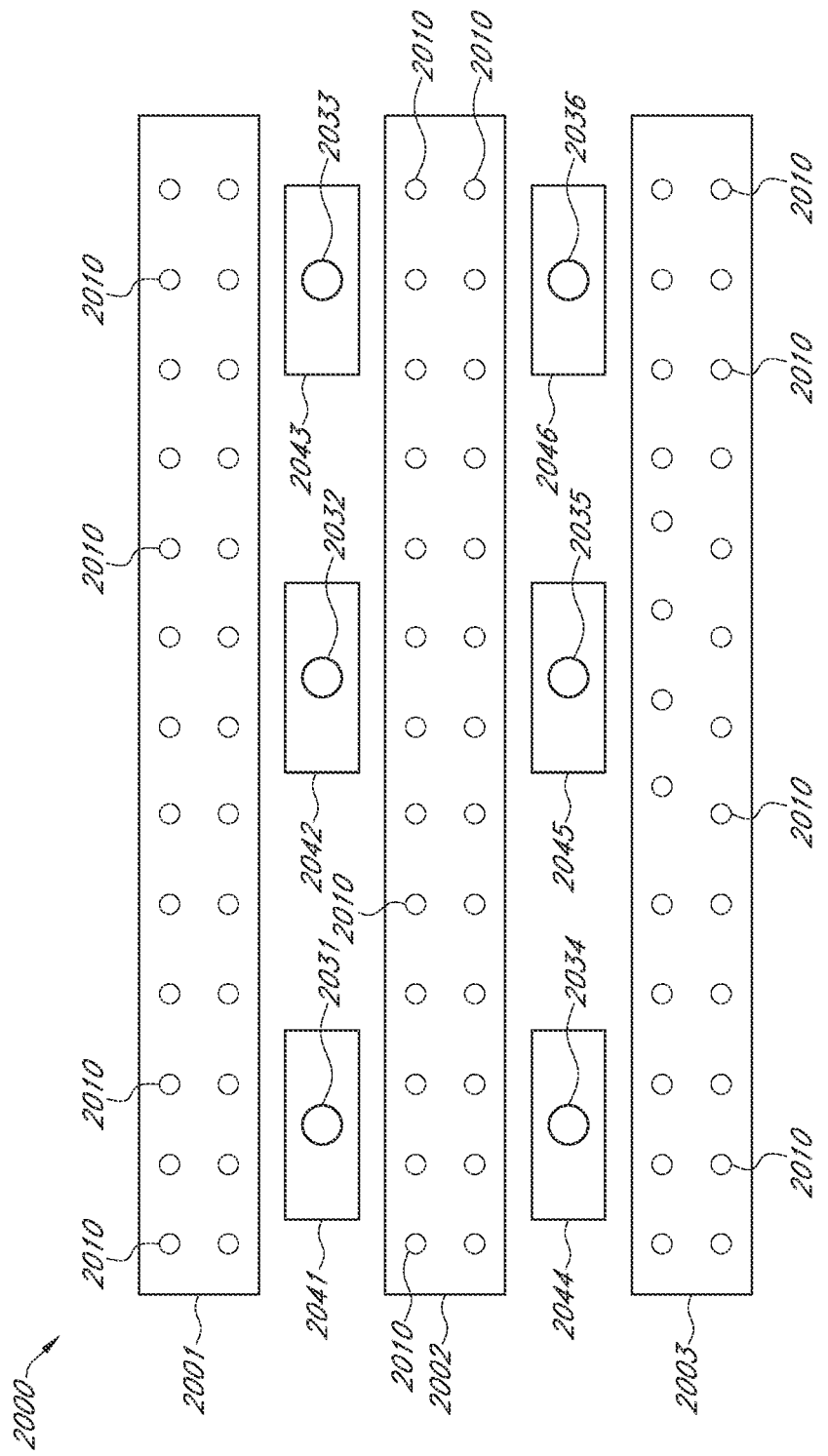
FIG. 20 schematically illustrates a partial top plan view of a floatation table configured to floatingly support a substrate with separate gas emitting devices provided to provide conveyance of the substrate in the x-y direction, in accordance with an exemplary embodiment of the present disclosure.
Figure 21:
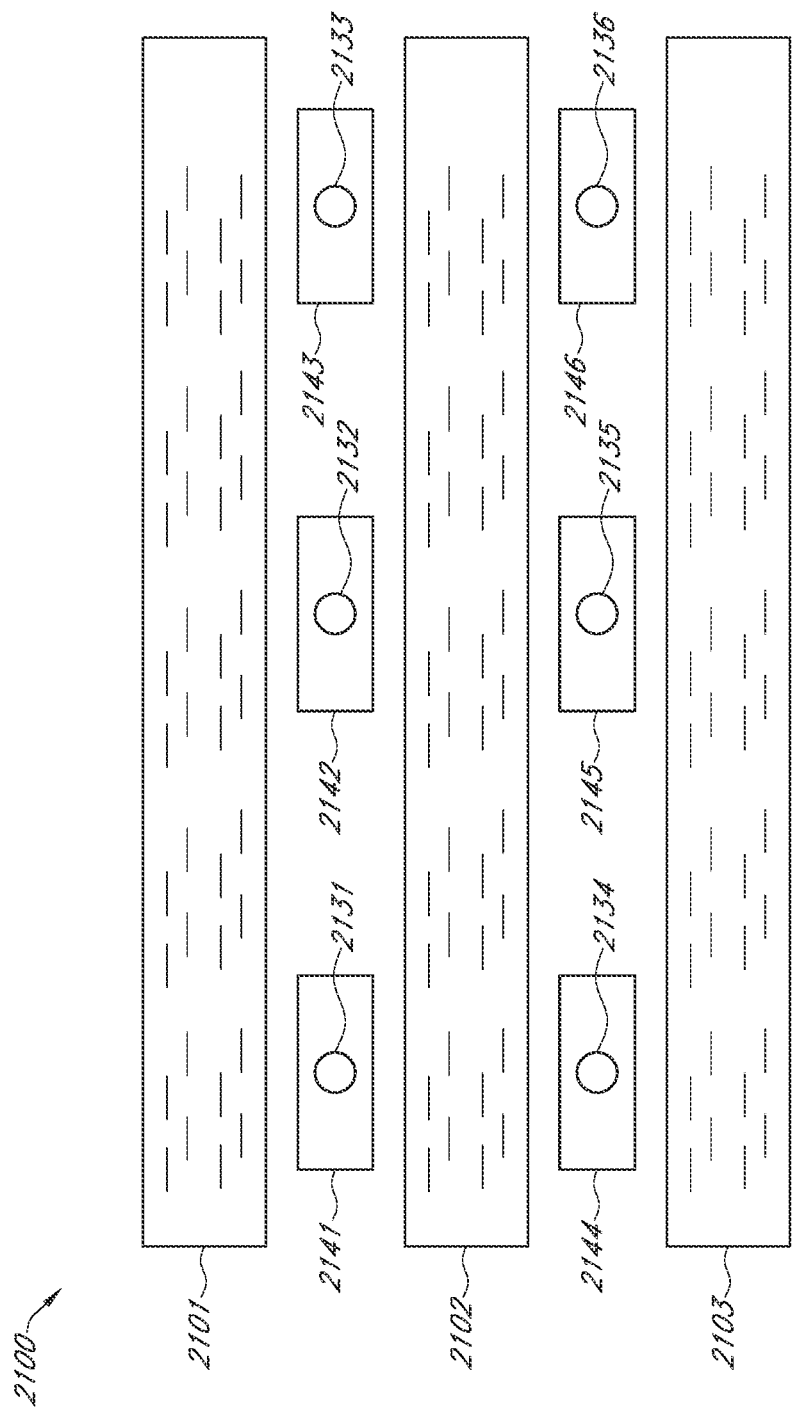
FIG. 21 schematically illustrates a partial top plan view of a floatation table configured to floatingly support a substrate with separate gas emitting devices provided to provide conveyance of the substrate in the x-y direction, in accordance with another exemplary embodiment of the present disclosure.

In various exemplary embodiments, the drag force created by the flows of the second gas for conveying (e.g., translating) a substrate (such as substrate 110) may be expressed by the following equation: $F_D = \rho u^2 C_D A$, where $F_D$ is the drag force, which is the force component in the horizontal direction along surface of floatation table (e.g., surface 115 of floatation table 105) (i.e., the direction of flow velocity or the force component in a direction parallel to the plane of surface 115 in the flow direction). Parameter ρ is a mass density of the gas flowing out of the nozzle head or other passage. Parameter u is a flow velocity relative to the substrate. Parameter A is an area between the substrate and a surface (e.g., surface 115 or a dedicated surface separately provided as shown in FIGS. 20 and 21). Parameter $C_D$ is a drag coefficient, which is a dimensionless coefficient related to the geometry of the substrate. Parameter $C_D$ reflects both skin friction and form drag. In general, the parameter $C_D$ depends on the Reynolds number.

The flow field produced by the gas flow of the second gas creates the drag force across the lower surface of the substrate. The drag force acts on the area A of substrate in the direction of the flow of the second gas. The drag force has an amplitude and a direction, and can be represented by a force vector. When the direction of the air flow relative to the x-y direction of the surface of the table is altered (e.g., when a nozzle head is rotated), the force vector changes its direction, i.e., the angle in which the drag force is acting on the substrate. As a result, the substrate is caused to move in the direction of the force vector that is being changed. When the acute angle α of the direction of gas flow relative to the surface of the table is changed (e.g., pivoting angle of the nozzle head is changed), the magnitude or amplitude of the drag force in the x-y plane may be changed, which may result in a change in the acceleration of the substrate. The drag force may also depend on the area A, which may be, for example, between the substrate and the floatation table in which the nozzle is provided. A nozzle placed close to the edge of the substrate may generate a smaller drag force than a nozzle provided near the center of the substrate because the area A is smaller at the edge. When multiple nozzles are used, the substrate may be translated and rotated using the same pressure source (e.g., same pressurized gas source). The flow fields generated by multiple nozzles can interact with one another where an angled (nonperpendicular) portion of one flow sums with another resulting in a small perpendicular force component and a large parallel force component assisting in more accurate conveyance of the substrate. Different nozzles placed in different locations can produce any number of combinations of translation and rotation motions of the substrate. With a suitable control system, the nozzles can create a versatile substrate transportation (e.g. conveyance) system. Likewise, similar controls may be achieved by controlling gas flows through any of the second passage configurations described herein, depending on the directions and acute angles relative to the surface of the substrate.

In the embodiment of FIG. 3, first controller 371 and second controller 372 are shown as separate controllers. In some embodiments, first controller 371 and second controller 372 may be the same controller, or may be parts of an integral controller. First controller 371 may control first control valve 361 to adjust the pressure and/or the flow rate of the first gas that is supplied to first nozzle 311 for forming the gas bearing to float substrate 110. Thus, first controller 371 controls the gas bearing formed by flows of the first gas out of first nozzle head 321. By controlling the gas bearing, the first controller 371 also controls the fly height of substrate 110 over or above surface 115 of floatation table 105. Second controller 372 may control second control valve 362 to adjust the pressure and/or the flow rate of the second gas that is supplied to second nozzle 312 for conveying (e.g., translating) substrate 110. Thus, second controller 372 controls the conveyance (e.g., translation) of substrate 110. By adjusting the flow rate, pressure, and the acute angle α (i.e., via controlling motor 332 to control pivoting of second nozzle head 322 with respect to surface 115), the drag force provided by the second gas for moving substrate 110 may be controlled by second controller 372. By controlling motor 332 to rotate second nozzle head 322 to adjust the acute angle orientation and x-y direction (e.g., the direction of the flow of gas in the plane of surface 115) of second nozzle head 322, second controller 372 may control the travel direction of substrate 110 on floatation table 105. The pressures and flow rates of the first gas and second gas may be the same or may be different.

Each of first nozzle head 321 and second nozzle head 322 may be pivoted with respect to surface 115 of floatation table 105 (i.e., pivoted about the z-axis). Various mechanisms may be used to achieve the pivoting. For example, in some embodiments, the entire nozzle head may pivot when driven by a motor (e.g., motor 331 or 332). In some embodiments, a part of the nozzle head may be pivot when driven by the motor. For example, each nozzle head may include a deflector that is driven by the motor to change its pivoting to thereby affect the flow direction of the second gas, such that the nonperpendicular angle α of the flow of the second gas may be adjusted.

The number of first control valves 361 may be the same as the number of first gas supply manifolds 341. The number of second control valves 362 may be the same as the number of second gas supply manifolds 342. For example, when system 100 includes two or more first gas supply manifolds 341, system 100 may include the same number of first control valves 361, each of first control valves 361 operably coupled to one of first gas supply manifolds 341.

Figure 4:
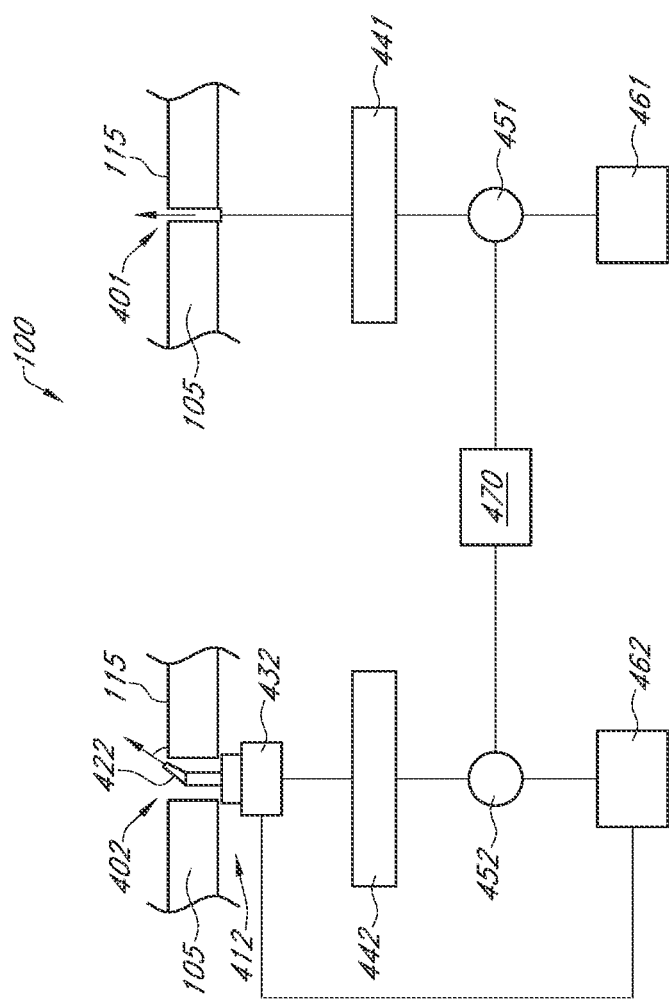
FIG. 4 schematically illustrates a partial side, cross-sectional view of yet another exemplary embodiment of a floatation table for supporting and conveying a substrate in accordance with the present disclosure.

FIG. 4 schematically illustrates yet another exemplary embodiment of components of system 100 shown in FIG. 1. In this embodiment, system 100 may include a plurality of first passages configured to flow a first gas to float substrate 110. System 100 may also include a plurality of second passages, in which a plurality of nozzles may be at least partially disposed to flow a second gas to convey (e.g., translate) substrate 110 along floatation table 105.

As shown in FIG. 4, system 100 includes a plurality of first passages 401 and a plurality of second passages 402. First passages 401 and second passages 402 may be openings provide at a surface of the floatation table, which may lead to a throughole or channel, and may otherwise have a similar construction as any of the openings and channels/throughholes described above with reference to FIGS. 2 and 3.

For illustrative purposes, cross-sectional views of only a single first passage 401 and a single second passage 402, along with portions of floatation table 105, are illustrated in FIG. 4 to schematically show the configuration of system 100. First passage 401 can be oriented and configured such that first gas flows out of the opening at the surface of the table in a direction that is substantially perpendicular to surface 115 of floatation table 105, as depicted by the arrow in FIG. 4. First gas from first passage 401 may be used to provide a gas bearing between a lower surface of substrate 110 and surface 115 of floatation table 105 to float substrate 110 above surface 115.

As with other embodiments, the embodiment of FIG. 4 may include a flow control system to control gas flows to and through the various passages. For example, first passage 401 may be operably (e.g., fluidically) coupled to first gas supply manifold 441 through a gas supply line to receive a first gas from first gas supply manifold 441. First gas supply manifold 441 may be similar to first gas manifolds 221 shown in FIG. 2, and/or other gas supply manifolds disclosed herein. First gas supply manifold 441 may distribute gas to a plurality of first passages 401.

First gas supply manifold 441 may be operably (e.g., fluidically) coupled to a first control valve 451 through a gas supply line. First control valve 451 may be similar to first control valve 231 and first control valve 361 shown in FIGS. 2 and 3, and/or any other control valve disclosed herein. First control valve 451 may be operably (e.g., fluidically) coupled with a gas source 470 through a gas supply line. Gas source 470 may be similar to gas source 260 and gas source 390 shown in FIGS. 2 and 3. Although a single gas source 470 is shown, system 100 may include more than one gas source. For example, two gas sources may be included in system 100 to separately and independently provide the first gas and the second gas. Either or any of the gas sources may include or be coupled to pressure regulators.

First control valve 451 may be operably (e.g., electrically) coupled to first controller 461. First controller 461 may be similar to first controller 241 and first controller 371 shown in FIGS. 2 and 3, and/or any other controllers disclosed herein. First controller 461 may be programmed or configured to control first control valve 451 to adjust the pressure and/or flow rate of the first gas supplied to first gas supply manifold 441 and then to first passages 401. That is, first controller 461 may be configured to control the gas bearing created by flows of the first gas out of first passages 401. By controlling the gas bearing, first controller 461 may control the fly height of substrate 110 over or above surface 115 of floatation table 105.

Second passage 402 may comprise a second opening leading to an throughhole or channel that also extends generally perpendicularly into (e.g., through) a thickness of floatation table 105. In some embodiments, the throughhole or channel in the thickness of the table may have other shapes or configurations. Second passage 402 also may include a nozzle 412 at least partially disposed in the second passage so as to flow gas through the surface 115 of the flotation table 105. Floatation table 105 may include a plurality of second passages, each having a nozzle 412. Nozzle 412 may be configured to flow a second gas out of second passage 402 in a direction that forms an acute angle α with respect to surface 115 of floatation table 105, as depicted by the arrow in FIG. 4. System 100 may include a plurality of nozzles 412 at least partially disposed in a plurality of second passages 402 to provide flows of the second gas to convey (e.g., translate) substrate 110 along surface 115 of floatation table 105.

Nozzle 412 may have similar structures and arrangements in the passages as nozzles 311 and 312 discussed above and shown in FIG. 3, and/or any other nozzles disclosed herein. Nozzle 412 may include a nozzle head 422 including a portion that is angled or sloped with respect to surface 115 of floatation table 105, such that the flow of the second gas out of nozzle head 422 is substantially in a direction at an acute angle α with respect to surface 115 of floatation table 105. The nozzle 412 may be disposed such that the nozzle head 422 does not protrude from the opening of the passage 402 beyond surface 115. In the embodiment of FIG. 4, the acute angle α can be any of the ranges discussed above in connection with FIGS. 2 and 3.

Nozzle 412 may include or be coupled to a motor 432 configured to adjust nozzle head 422. For example, motor 432 may cause nozzle head 422 to rotate around a central axis of nozzle 412. Motor 432 may also cause nozzle head 422 to pivot with respect to surface 115 of floatation table 105, so as to change the acute angle α of the flow of the second gas. Motor 432 may be similar to motors 331 and 332 shown in FIG. 3.

Nozzle 412 may be operably (e.g., fluidically) coupled with a second gas supply manifold 442 through a gas supply line to receive a second gas from second gas supply manifold 442. Second gas supply manifold 442 may be similar to second gas supply manifold 342 discussed above and shown in FIG. 3, and/or any other gas supply manifolds disclosed herein.

Second gas supply manifold 442 may be operably (e.g., fluidically) coupled to second control valve 452. Second control valve 452 may be similar first gas control valve 451 and/or other control valves disclosed herein. Second control valve 452 may be operably (e.g., fluidically) coupled to gas source 470 through a gas supply line to receive gas from gas source 470. Second control valve 452 may be operably (e.g., electrically) coupled to second controller 462. Second controller 462 may be similar to first controller 461 and/or other controllers disclosed herein. Second controller 462 may control second control valve 452 to adjust the pressure and/or flow rate of the second gas supplied to second gas supply manifold 442 and then to nozzle 412.

In the embodiments shown in FIG. 4, first controller 461 and second controller 462 are shown as separate controllers. In some embodiments, first controller 461 and second controller 462 may be the same controller, or may be parts of an integral controller. First controller 461 may control the first control valve 451 to adjust the pressure and/or the flow rate of the first gas that is supplied to first openings 401. First controller 461 therefore controls the gas bearing formed by flows of the first gas out of first openings 401 for floating substrate 110. By controlling the gas bearing, the first controller 461 also controls the fly height of substrate 110 over or above surface 115 of floatation table 105. Second controller 462 may control the second control valve 452 to adjust the pressure and/or the flow rate of the second gas that is supplied to nozzle 412. Second controller 462 therefore controls the second gas that conveys (e.g., translates) substrate 110. By adjusting the flow rate, pressure, and the acute angle α (i.e., via controlling motor 432 to adjust the pivoting angle of nozzle head 422 with respect to surface 115), the drag force provided by the second gas for conveying (e.g., translating) substrate 110 may be controlled by second controller 462. By controlling motor 432 to rotate nozzle head 422 to adjust the acute angle orientation and x-y pointing direction (e.g., the direction of the flow of second gas in the plane of surface 115) of nozzle head 422, second controller 462 may control the travel direction of substrate 110 on floatation table 105. The pressures and flow rates of the first gas and second gas may be the same or may be different.

Figure 5:
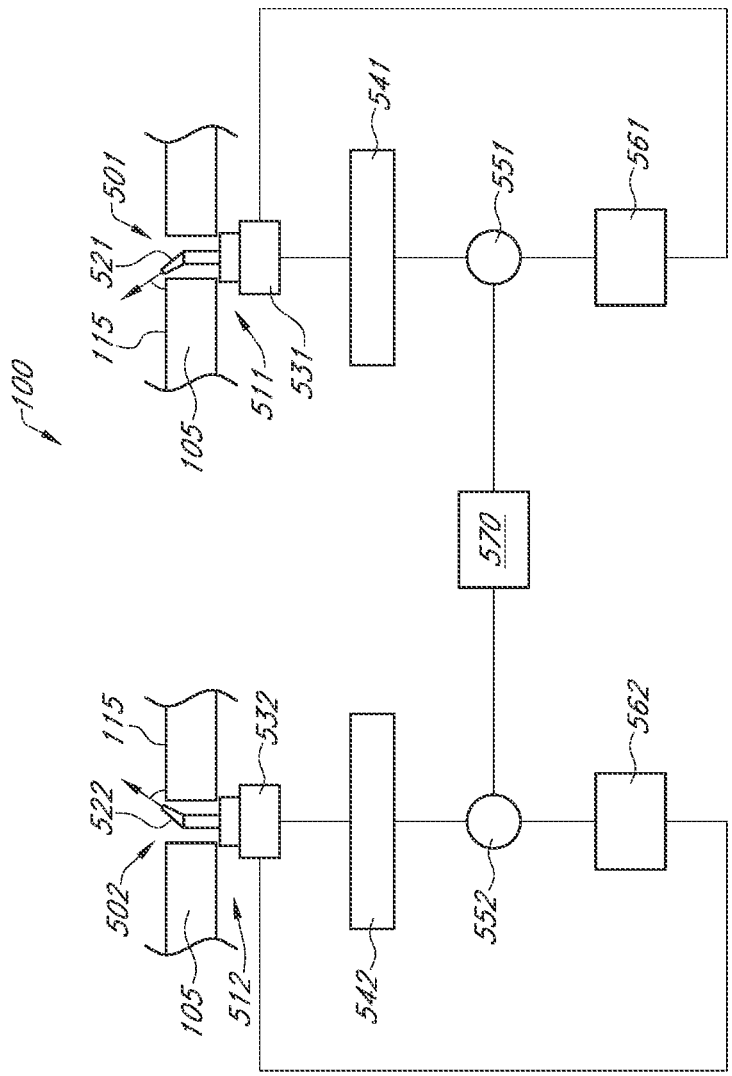
FIG. 5 schematically illustrates a partial side, cross-sectional view of yet another exemplary embodiment of a floatation table for supporting and conveying a substrate in accordance with the present disclosure.

FIG. 5 schematically illustrates another exemplary embodiment of components of system 100. In this embodiment, system 100 may include a plurality of first passages 501 and a plurality of second passages 502 each including a nozzle (e.g., a first nozzle 511 and a second nozzle 512, respectively), similar to the exemplary embodiments described above. First nozzle 511 and second nozzle 512 may each be similar to nozzles 311, 312, and 412, or any other nozzles disclosed herein. Flows of the first gas from the first nozzles 501 and flows of the second gas from the second nozzles 502 may be used together to establish a gas bearing to float substrate 110. For example, the respective x-y pointing directions of the nozzle heads (a first nozzle head 521 and a second nozzle head 522) of the first and second nozzles 511 and 512 may be adjusted such that they are opposite each other. In other words, the nozzle heads 521 and 522 may face in opposite directions generally toward each other. Further, the first nozzle head 521 and second nozzle head 522 may be pivoted about the z-axis such that the flows of gases out of first nozzle head 521 and second nozzle head 522 may form the same acute angle α with respect to the surface 115 of the floatation table 105.

By pointing the nozzle heads 521 and 522 in opposite directions and by having the same acute angle α, the drag force of the flows of the first gas and the drag force of the flows of the second gas may be cancelled out when the pressures and flow rates of the first and second gases are also suitably adjusted, thereby leaving only the upward lifting force components created by the flows of the first gas and the flows of the second gas. As a result, a gas bearing may be established between surface 115 and a lower surface of substrate 110 for floating substrate 110 in a stationary manner. Substrate 110 may be floated at a controlled fly height over surface 115 of floatation table 105 without being moved from one region of floatation table 105 to another (i.e., without being conveyed). When the orientations (e.g., the rotating angles and pivoting angles) of the first nozzle head 521 and second nozzle head 522, and the pressures and flow rates of the first gas and second gas are configured such that the drag forces generated by the flows of the first gas and the second gas cannot be cancelled out, substrate 110 may also be conveyed (e.g., translated) by the resulting drag force while being floated by the gas bearing. Thus, the system 100 of FIG. 5 may be controlled to achieve only the floatation function or both the floatation and conveyance (e.g., translation) functions.

As shown in FIG. 5, first nozzle head 521 may be disposed so as to not protrude beyond the opening of the passage 501 at surface 115. First nozzle head 521 of first nozzle 511 may be adjustable. First nozzle head 521 may be similar to first nozzle head 321 or any other adjustable nozzle head disclosed herein. First nozzle 511 may include or be coupled with a first motor 531. First motor 531 may be similar to first motor 331 or any other motor disclosed herein. First motor 531 may be operably coupled to first controller 561. First controller 561 may be similar to first controller 371 or any other controller disclosed herein. First controller 561 may be programmed or configured to control first motor 531 to rotate first nozzle head 521 about a central axis of first nozzle 511, so as to control the travel direction of substrate 110 on floatation table 105. First controller 561 may also control first motor 531 to adjust the pivoting direction (i.e., acute angle α) of first nozzle head 521 with respect to surface 115, so as to change the drag force of the flows of the second gas for conveying (e.g., translating) substrate 110.

The embodiment of FIG. 5 may include a flow control system. In the flow control system, first nozzle 511 may be operably (e.g., fluidically) coupled with a first gas supply manifold 541. First gas supply manifold 541 may be similar to first gas supply manifold 441 or any other gas supply manifolds disclosed herein. First nozzle 511 may receive a first gas from first gas supply manifold 541. First gas supply manifold 541 may distribute the first gas to a plurality of first nozzles 511, such as a plurality of first nozzles 511 in a row or a column. In some embodiments, system 100 may include a single first gas supply manifold 541 configured to supply the first gas to all of the first nozzles 511. In some embodiments, system 100 may include two or more first gas supply manifolds 541, each configured to distribute the first gas to differing ones or a group of the plurality of first nozzles 511.

First gas supply manifold 541 may be operably (e.g., fluidically) coupled with first control valve 551. First control valve 551 may be similar to first control valve 361 or any control valves disclosed herein. First control valve 551 controls the pressure and/or flow rate of the first gas supplied to first gas supply manifold 541. First control valve 551 may be operably (e.g., fluidically) coupled with a gas source 570 to receive the first gas from gas source 570. Gas source 570 may be similar to gas source 260 or any other gas sources disclosed herein. First control valve 551 may be operably (e.g., electrically) coupled with first controller 561. First controller 561 may control first control valve 551 to change the pressure and/or flow rate of the first gas supplied to first gas supply manifold 541. Although a single gas source 570 is shown in FIG. 5, system 100 may include more than one gas source. For example, system 100 may include a first gas source to provide a first gas to first nozzles 511 for floating substrate 110, and a second gas source to provide a second gas to second nozzles 512 for conveying (e.g., translating) substrate 110.

As shown in FIG. 5, second nozzle 512 may be disposed so as not protrude beyond the opening of the passage 502 at surface 115. Second nozzle 512 may be similar to first nozzle 511. For example, second nozzle head 522 may be fixed in its orientation (e.g., fixed rotation angle and fixed pivoting angle such that the acute angle α is fixed and not adjustable), or may be adjusted in its orientation (including adjustable rotation angle and pivoting angle).

Second nozzle 512 may be operably (e.g., fluidically) coupled with second gas supply manifold 542. Second gas supply manifold 542 may be similar to first gas supply manifold 541 or any other gas supply manifolds disclosed herein. Second gas supply manifold 542 may supply second gas to a plurality of second nozzles 512. In some embodiments, system 100 may include a single second gas supply manifold 542 to all of second nozzles 512. In some embodiments, system 100 may include a plurality of gas supply manifolds 542, each configured to supply the second gas to differing ones or a group a plurality of second nozzles 512.

Second gas supply manifold 542 may be operably (e.g., fluidically) coupled with a second control valve 552. Second control valve 552 may be similar to first control valve 551 or any other control valves disclosed herein. Second control valve 552 may control the pressure and/or flow rate of the second gas supplied to second gas supply manifold 542. Second control valve 552 may be operably (e.g., fluidically) coupled with gas source 570, and may receive the second gas from gas source 570. The pressures and flow rates of the first gas and second gas may be the same or may be different. The gas source 570 can include or be coupled to a pressure regulator to control pressure of gas flowing through the flow control system.

Second control valve 552 may be operably (e.g., electrically) coupled with a second controller 562. Second nozzle 512 may include or be operably coupled with a second motor 532. Second motor 532 may cause second nozzle head 522 to rotate about a central axis of second nozzle 512 and/or to pivot with respect to surface 115. Second motor 532 may be operably (e.g., electrically) coupled with second controller 562.

Second controller 562 may be similar to first controller 561 or any other controllers disclosed herein. Second controller 562 may be programmed or configured to control second motor 532 to rotate second nozzle head 522 about a central axis of second nozzle 512. Second controller 562 may also be programmed or configured to control second motor 532 to adjust the pivoting angle (i.e., the acute angle α) of second nozzle head 522 relative to surface 115. Controlling the rotation of second nozzle head 522 may change the travel direction of substrate 110, and controlling the pivoting of second nozzle head 522 may change the drag force applied to substrate 110 for moving substrate 110 along surface 115 of floatation table 105.

Second controller 562 may be configured or programmed to control second control valve 552 to adjust the pressure and/or flow rate of the second gas supplied from gas source 570 to second gas supply manifold 542. Second controller 562 may control the pressure and/or flow rate of the second gas such that the drag force generated by the flows of the second gas between surface 115 and substrate 110 may be sufficient to convey (e.g., translate) substrate 110 along surface 115.

Figure 23:
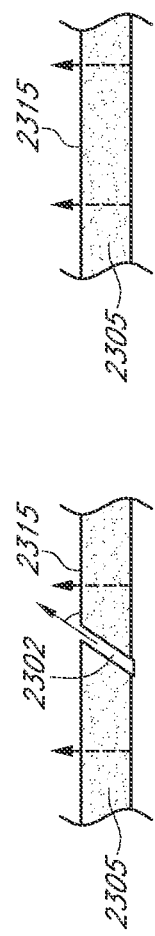
FIG. 23 schematically illustrates a partial side, cross-sectional view of another exemplary embodiment of a floatation table for supporting and conveying a substrate in accordance with the present disclosure.

The embodiments of floatation tables described with reference to FIGS. 2-5 above include structures in which the openings (including, e.g., channels or throughholes) in the table that emit the gas (either directly or by situating a nozzle in the passage leading to the opening) are drilled or otherwise formed in the table. In another embodiment, rather than openings being drilled or otherwise formed in a solid construction of a floatation table, the floatation table can be made of a porous or sintered material, and the first plurality of passages that flow the gas for a gas bearing are the pores distributed throughout and inherent due to the porosity of the material itself, rather than via openings that are drilled or otherwise formed through the table. In an embodiment where the floatation table is made of a porous our sintered material, a plurality of second passages that are constructed by drilling or otherwise formed in the porous material of the table, with or without nozzles disposed therein, may be used to provide the nonperpendicular (e.g., acute angled) gas flow to provide X-Y translation (conveyance) of the substrate, similar to the embodiments of FIGS. 2-5 described above. FIG. 23 depicts a partial, side cross-sectional view of an exemplary floatation table 2305 made of a porous or sintered material having passages in the form of pores that allows for gas to be emitted from the table to provide a gas bearing to float a substrate, as depicted by the dashed arrows. The floatation table 2305 also includes the second plurality of passages 2302 that are angled, similar to the embodiments of FIG. 2, to emit gas at an acute angle as described above to convey (e.g., translate) a substrate along the surface 2315 of the floatation table 2305. Instead of angled opening 2302 directly emitting the gas, the floatation table 2305 could include passages with nozzles configured to emit gas at a nonperpendicular (e.g., acute angle) for conveyance of the substrate, similar to the embodiments of FIGS. 3-5, e.g., to provide a drag force having a directional component generally parallel to a surface of the substrate as described above. The flow control system, including the fluidic manifold(s), gas supply lines, valves, gas source(s), controller(s), etc. have been omitted for simplicity in the embodiment of FIG. 23, but one of ordinary skill in the art would understand how to utilize the various arrangements so as to described in FIGS. 2-5, with appropriate modifications, to control flows through the first plurality of openings (pores of the floatation table) to achieve a gas bearing and through the second plurality of openings used for conveying the substrate.

Figure 6:
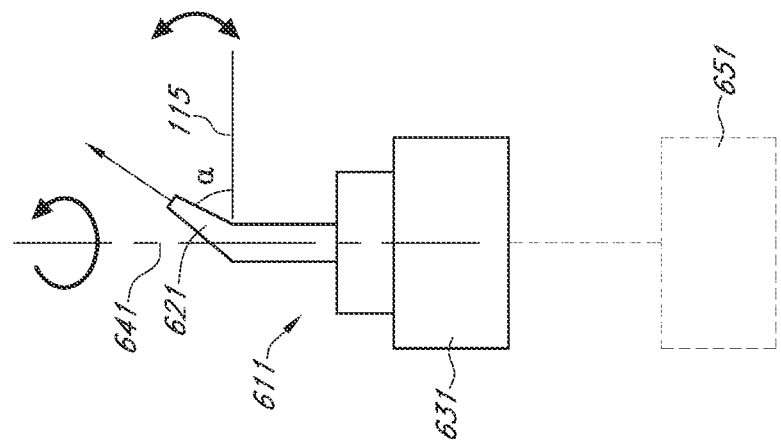
FIG. 6 schematically illustrates a nozzle in accordance with an exemplary embodiment of the present disclosure.

FIG. 6 schematically illustrates an exemplary nozzle, and the rotation and pivoting of its nozzle head, that can be used with any of the exemplary embodiments described herein. As shown in FIG. 6, nozzle 611 includes a nozzle head 621. Nozzle 611 may include or be operably coupled to a motor 631 that can impart a driving force causing nozzle head 621 to rotate about a central axis 641 of nozzle 611 to change the rotation angle. The central axis of nozzle 611 may be perpendicular to a surface (e.g., surface 115 of floatation table 105). Motor 631 may also cause nozzle head 621 to pivot with respect to surface 115 (i.e., about the z-axis) to change the acute angle α. Pivoting the nozzle head 621 about the z-axis (as shown by the double-headed arrows in FIG. 6) thus adjusts the acute angle α at which the gas flows from the nozzle and relative to the surface 115. Motor 631 may be operably (e.g., electrically) coupled with a controller 651, which may be an embodiment of any controller disclosed herein. Controller 651 may control motor 631 to cause nozzle head 621 to rotate and/or to pivot. FIG. 6 also shows an (x, y, z) coordinate system. Aside from pivoting of the nozzle head 621 about the z-axis, various exemplary embodiments also include rotation of nozzle head 621 about a central axis 641, which may correspond to the z axis, as reflected by the single-headed arrow in FIG. 6. In this way, the pointing direction of the nozzle head 621 and thus gas flow direction (i.e., in the x-y direction of the surface 115) can be adjusted.

Figure 7:
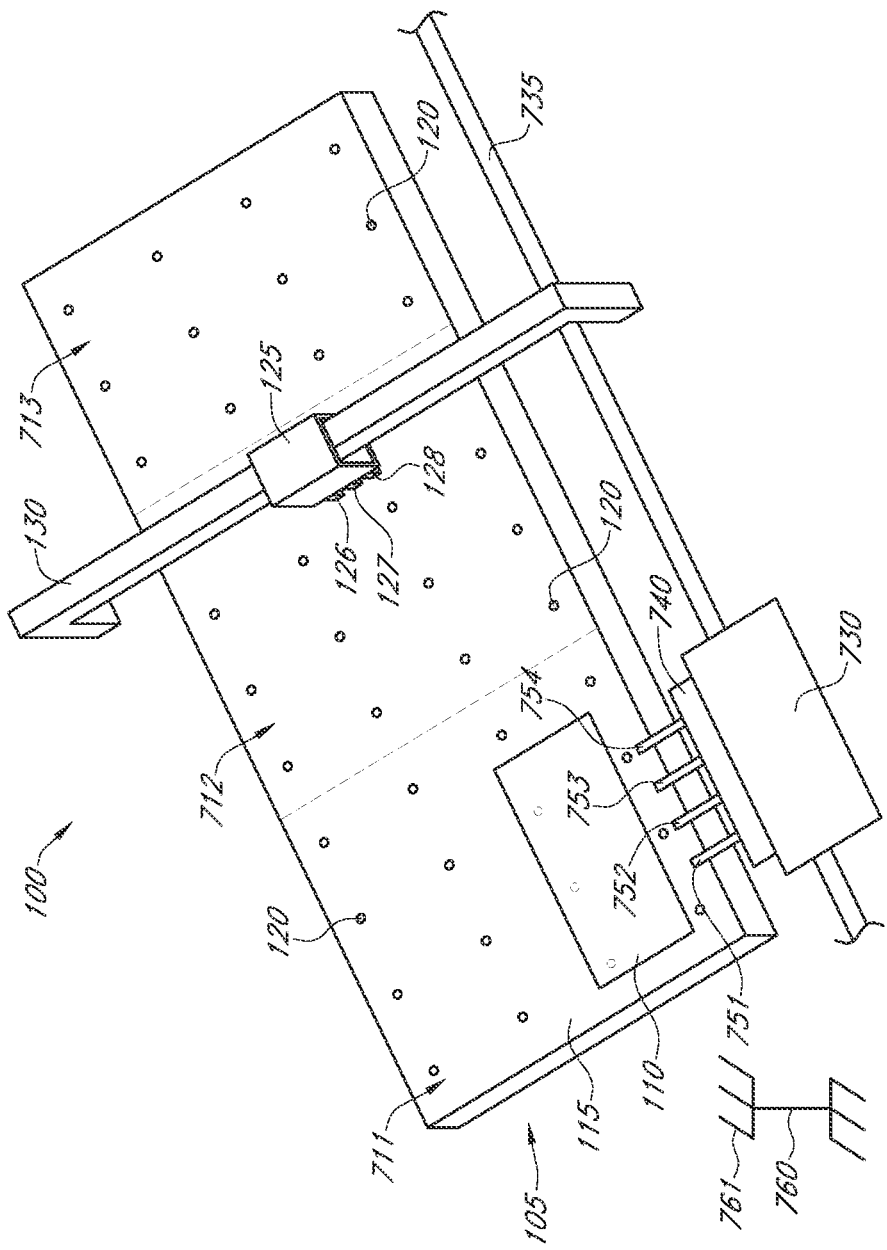
FIG. 7 schematically illustrates a perspective view of various printing system components for electronic device manufacture in accordance with an exemplary embodiment of the present disclosure.

FIG. 7 schematically illustrates yet another exemplary embodiment of components of system 100. System 100 may include various components shown in FIG. 1, such as floatation table 105 having surface 115 and a plurality of passages 120. Passages 120 may take any of the configurations shown and described with reference to FIGS. 2-5. System 100 may include bridge 130, printhead assembly 125 mounted on bridge 130, which may include a plurality of printheads 126, 127, and 128. Floatation table 105 may include a plurality of zones or regions 711, 712, and 713. Zone 711 may be an infeed zone where substrate 110 may be loaded onto floatation table 105, for example, by a robotic arm 760 having an end effector 761 in a manner those having ordinary skill in the art are familiar with. In some embodiments, instead of being loaded onto floatation table 105, substrate 110 may be conveyed (e.g., translated) from another or module (not shown in FIG. 7) onto floatation table 105.

Zone 712 may be a printing zone, where substrate 110 may be printed or deposited with a material, such as an organic material, by printhead assembly 125. Zone 713 may be an outfeed zone, where substrate 110, after being printed with the material, may be conveyed (e.g., translated) out of the printing zone 712. Substrate 110 may be held at outfeed zone 713 or may be conveyed (e.g., translated) from outfeed zone 713 to another region of system 100 that is not shown in FIG. 7. For example, substrate 110 with the material deposited thereon may be unloaded by another robotic arm with an end effector (not shown) from outfeed zone 713. In some embodiments, substrate 110 with the material deposited thereon may be conveyed (e.g., translated) to a treatment zone, in which one or more treatment devices, such as thermal treatment devices, may be used to treat the material deposited on substrate 110 to form layers that are parts of an OLED device.

As shown in FIG. 7, robotic arm 760 may be configured to load and/or unload substrate 110 to and from floatation table 105. Robotic arm 760 may include end effector 761, which may include a chuck and/or a plurality of forks. System 100 may also include a gripper system 730 configured to grip substrate 110. Gripper system 730 may include a griping mechanism 740, which may include a plurality of gripping devices 751, 752, 753, and 754. In some embodiments, gripping mechanism 740 may include a single gripping device, or may include more than or less than the number of gripping devices shown in the embodiment of FIG. 7. Gripping devices 751, 752, 753, and 754 may be configured to grip substrate 110 at a peripheral region of substrate 110. The peripheral region of substrate 110 may be a non-printing region or non-active region, on which the organic material may not be deposited to form layers of an OLED device. Gripping substrate 110 at the peripheral region may reduce the mura phenomenon.

Gripper system 730 may be mounted on a track 735 disposed along floatation table 105. FIG. 7 shows track 735 being disposed side by side with floatation table 105. In some embodiments, track 735 may be disposed on floatation table 105, or affixed to an edge of floatation table 105. Gripper system 730 may be movable along track 735. Gripper system 730 may be configured to grip substrate 110, and move substrate 110 along floatation table 105, for example, from zone 711 to zone 712 and/or zone 713. In some embodiments, gripper system 730 may hold (e.g., by gripping) substrate 110 and move substrate 110 to the printing zone 712. During the printing process, gripper system 730 may move substrate 110 back and forth along track 735, such that substrate 110 may be precisely positioned relative to printhead assembly 125. Printheads 126, 127, and 128 may deposit the organic material onto different regions of substrate 110 in a predetermined pattern, for example. During the printing process, printhead assembly 125 may also be moved along bridge 130, such that the organic material may be deposited onto different regions of substrate 110 in the width direction of floatation table 105.

After the material is deposited onto substrate 110, gripper system 730 may move substrate 110 to the outfeed zone 713, where substrate 110 may be temporarily held, treated by a treatment device, conveyed (e.g., translated) to another region of system 100 that is not shown in FIG. 7, or unloaded by another robotic arm that is not shown in FIG. 7. While gripper system 730 grips and moves substrate 110 along floatation table 105, substrate 110 may continue to be supported by the gas bearing flown out of ports 120 of floatation table 105. In some embodiments, while gripper system 730 grips and moves substrate 110 along floatation table 105, substrate 110 may not be supported by a gas bearing.

Gripper systems may take a variety of forms. Reference is made to U.S. Pat. No. 9,505,245, issued Nov. 29, 2016, hereby incorporated by reference herein, for one exemplary, non-limiting configuration of a gripper system that may be used in conjunction with the various exemplary embodiments described herein.

FIG. 7 shows an application of the configurations shown in FIGS. 2-6 for conveying (e.g., translating) substrate 110. In the application shown in FIG. 7, a banking process will be discussed below. In the banking process, substrate 110 is moved a short distance (via relatively fine conveyance (translational and/or rotational movement)) to align and abut one or more edges of the substrate against one or more stoppers (not shown in FIG. 7), such that gripper system 730 can grip substrate 110 at a desired peripheral region(s) of substrate 110. For example, after substrate 110 is moved closer to the area where gripper system 730 is located, or after substrate 110 is loaded onto floatation table 105 by robotic arm 760, substrate 110 may rest on lifting pins located on floatation table 105. Substrate 110 may then be moved via conveyance a short distance toward gripper system 730, such that substrate 110 is pushed against stoppers distributed at predetermined locations on floatation table 105. After substrate 110 is pushed against stoppers, gripper system 730 may grip substrate 110 at the peripheral regions of substrate 110.

Figure 8:
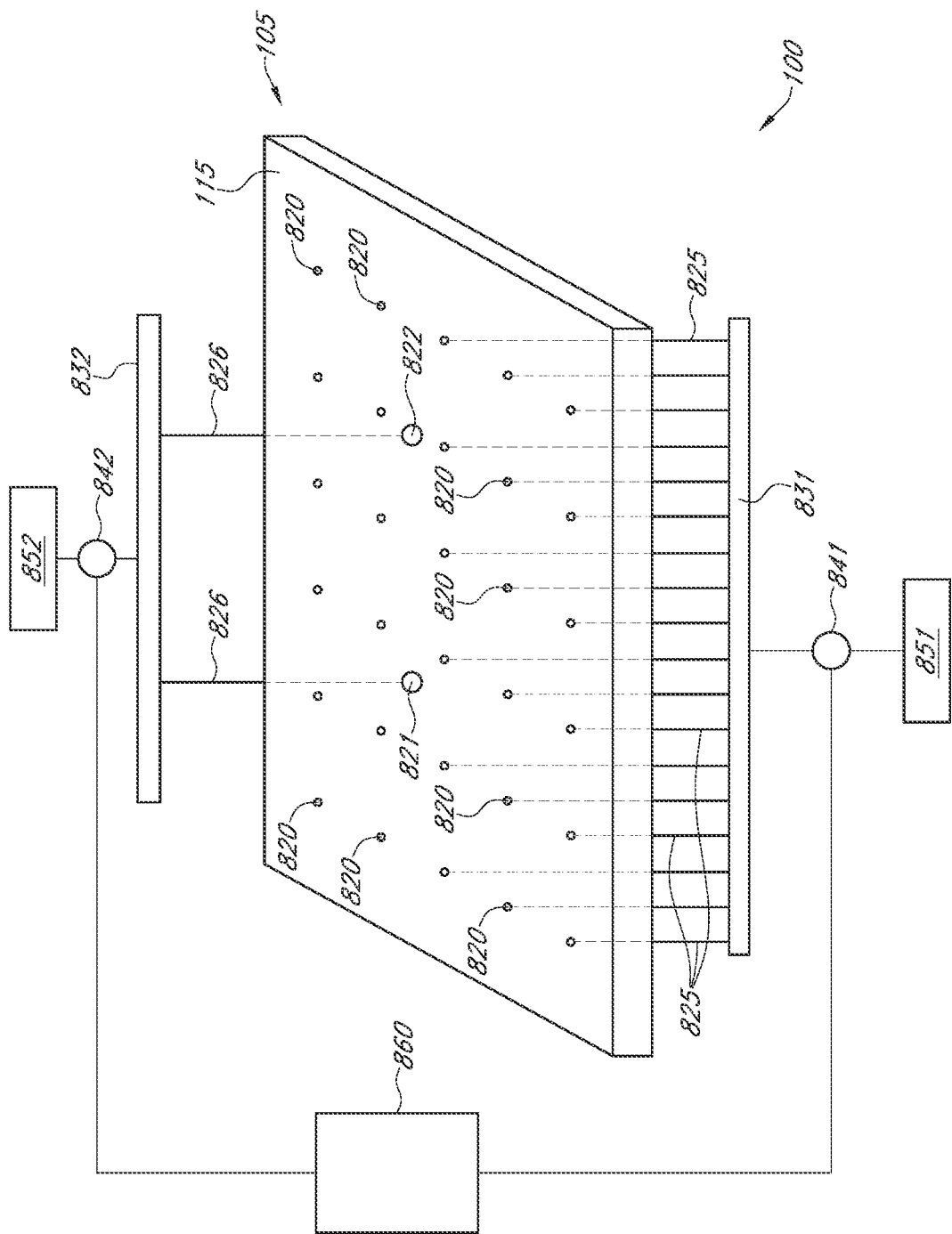
FIG. 8 schematically illustrates a perspective view of various printing system components for electronic device manufacture in accordance with another exemplary embodiment of the present disclosure.

FIG. 8 schematically illustrates an embodiment of system 100 configured for performing an exemplary banking process in accordance with the present disclosure. One or more passages (e.g., two passages 821, 822 shown in FIG. 8) may be provided on floatation table 105, which may be separate from passages configured for providing floatation of the substrate. In some embodiments, the one or more passages may be angled, similar to second passage 202 shown in FIG. 2. In some embodiments, the one or more passage may each include a nozzle with an adjustable nozzle head at least partially disposed therein, similar to nozzles 311, 312, 412, 511, 512, and 611 shown in FIGS. 2-6, for providing flows of the second gas to convey (e.g., translate) substrate 110.

As shown in FIG. 8, system 100 may include floatation table 105. Floatation table 105 may include a plurality of first passages 820 opening at surface 115. The first passages 820 may be parts of or embodiments of passages 120 shown in FIG. 1. First passages 820 may be configured to provide floatation to substrate 110 (not shown in FIG. 8). For example, first passages 820 may be similar to passages 201, 301, 401, 501, and 502. A first gas may flow through first passages 820 to form a gas bearing between substrate 110 and surface 115 of floatation table 105. The gas bearing may be sufficient to float substrate 110 over or above surface 115.

First passages 820 may each be operably (e.g., fluidically) coupled with a first gas supply manifold 831 through individual gas supply lines 825. First gas supply manifold 831 may be similar to any of the gas supply manifolds disclosed herein. First gas supply manifold 831 may be operably (e.g., fluidically) coupled to first control valve 841. First control valve 841 may be similar to any of the control valves disclosed herein. First control valve 841 may control the pressure and/or flow rate of the first gas supplied to first gas supply manifold 831. First control valve 841 may be operably (e.g., fluidically) coupled with a gas source 860, which may include or be coupled to a pressure regulator, to receive the first gas from gas source 860. Although a single gas source 860 is shown in FIG. 8, in some embodiments, two or more gas sources may be included to independently provide gases for floating substrate 110 and for conveying (e.g., translating) substrate 110.

First control valve 841 may be operably (e.g., electrically) coupled with a first controller 851. First controller 851 may be similar to any other controllers disclosed herein. First controller 851 may be programmed or configured to control first control valve 841 to adjust the pressure and/or flow rate of the first gas supplied to first gas supply manifold 831, thereby controlling the gas bearing formed by the first gas.

As shown in FIG. 8, floatation table 105 may include one or more second passages that are provided separately from first passages 820. In the embodiment shown in FIG. 8, two second passages 821 and 822 are shown. In some embodiments, system 100 may include more than two or less than two second passages. Each of second passages 821 and 822 may be operably (e.g., fluidically) coupled with a second gas supply manifold 832 through individual gas supply lines 826. Second gas supply manifold 832 may be similar to any gas supply manifold disclosed herein. Second gas supply manifold 832 may be operably (e.g., fluidically) coupled with a second control valve 842. Second control valve 842 may be similar to any control valve disclosed herein. Second control valve 842 may be configured to control the pressure and/or the flow rate of the second gas supplied to second gas supply manifold 832.

Second control valve 842 may be operably (e.g., fluidically) coupled to gas source 860 to receive the second gas from gas source 860. Second control valve 842 may also be operably (e.g., electrically) coupled to second controller 852. Second controller 852 may be similar to any controller disclosed herein. Second controller 852 may be programmed or configured to control second control valve 842 to adjust the pressure and/or flow rate of the flows of the second gas supplied to second gas supply manifold 832. A pressure regulator may also be coupled to the controllers or another controller to control pressure in the flow control system.

The second passages 821 and 822 may be provided separately from first passages 820, as shown in FIG. 8. In some embodiments, second passages 821 and 822 may not be separately provided. Instead, second passages 821 and 822 may be two passages selected from first passages 820. Second passages 821 and 822 may be disposed at suitable locations on floatation table 105 for performing the banking process of substrate 110 with respect to gripper system 730. For example, referring to FIGS. 7 and 8, second passages 821 and 822 may be located at a non-peripheral region of floatation table 105. In some embodiments, second passages 821 and 822 may be located below a central region of substrate 110. The central region of substrate 110 may correspond to a region on which the organic material may be deposited onto the upper surface of substrate 110.

In some embodiments, second passages 821 and 822 may have a configuration similar to second passage 202 shown in FIG. 2. That is, each of second passages 821 and 822 may be angled, such that the second gas flows out of second passages 821 and 822 in a direction that forms an acute angle with respect to surface 115 of floatation table 105.

In some embodiments, second passages 821 and 822 may have a configuration similar to passages 301, 302, 402, 501, and 502, and may each include a nozzle with an adjustable nozzle head. The adjustable nozzle head may be adjusted to change its rotation angle and/or pivoting angle, as discussed above. For example, the adjustable nozzle head may be rotated to change the travel direction of substrate 110. The adjustable nozzle head may be pivoted to change the acute angle α, thereby affecting the drag force of the flow of the second gas for conveying (e.g., translating) substrate 110. When the nozzle and/or the angled passage 201 without a nozzle is used for performing the banking process, the device may be referred to as an "air banker" (as discussed above, an air banker does not have to be limited to the use of air as the gas supply used).

Figure 9:
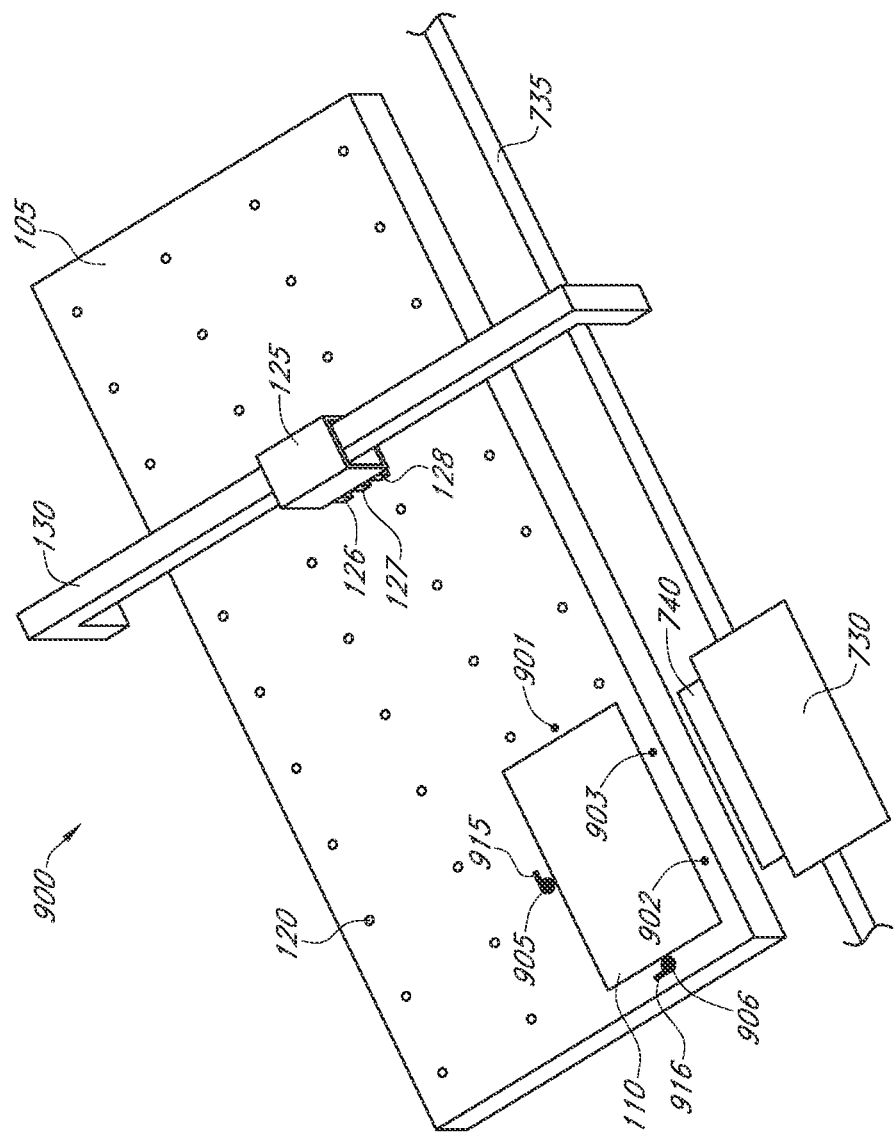
FIG. 9 schematically illustrates a perspective view of various printing system components for electronic device manufacture in accordance with another exemplary embodiment of the present disclosure.

FIG. 9 illustrates a system 900 in which motorized bankers are used to perform the banking process. System 900 may include various components similar to those depicted in FIG. 7, such as floatation table 105 with passages 120, bridge 130, printhead assembly 125 with printheads 126, 127, and 128, track 735, and gripper system 730 with gripping mechanism 740 (gripping devices 751, 752, 753, and 754 are omitted for simplicity of illustration).

System 900 may include a plurality of motorized bankers configured to perform the banking process of substrate 110, to prepare substrate 110 for gripper system 730 to grip substrate 110. For example, system 900 may include a first motorized banker 905 and a second motorized banker 906. First motorized banker 905 may include a first swing arm 915 and second motorized banker 906 may include a second swing arm 916. System 900 may include a plurality of stoppers disposed on floatation table 105 and configured to stop the movement of substrate 110. For example, system 900 may include a first stopper 901, a second stopper 902, and a third stopper 903 located at the locations shown in FIG. 9, or any other suitable locations. The stoppers may be any suitable stoppers, such as pins, wheels, etc. The stoppers may be retractable. For example, the stoppers may be pins that are disposed within openings of floatation table 105. The stoppers may be retracted into the openings when not in use, and may be extended out of the openings to stop substrate 110 when in use. Stoppers 902 and 903 may be disposed along a side of floatation table 105 where gripper system 730 is located.

Motorized bankers 905 and 906 may be at least partially disposed in openings of floatation table 105. Motorized bankers 905 and 906 may be retractable and extendable. For example, motorized banker 905 and 906 may be retracted into the openings in which they are disposed when not in use, and may be extended out of the openings when in use. The openings for housing motorized bankers 905 and 906 may be different from the openings for flowing gases to provide floatation and conveyance (e.g., translation) of substrate 110. In some embodiments, the openings for housing motorized bankers 905 and 906 may be larger in size (e.g., diameter) than the passages (e.g., those shown in FIGS. 1-6) for flowing gases to provide floatation of substrate 110. Each motorized banker 905, 906 may include a swing arm 915, 916 configured to be swingable about an axis of the motorized banker. When the swing arms 915, 916 swing they may push against edges of substrate 110, and thus push substrate 110 to abut against stoppers 901, 902, and 903. At this position, substrate 110 may be gripped by gripper system 730.

When substrate 110 is loaded onto floatation table 105, such as by robotic arm 760 with end effector 761, substrate 110 may be supported by the gas bearing provided by floatation table 105. Alternatively, or additionally, substrate 110 may be supported by lift pins disposed in openings of floatation table 105. The openings for disposing lift pins may be different from the openings of passages for flowing gases to provide floatation of substrate 110. While substrate 110 is supported, motorized banker 905 and 906 may be activated to push substrate 110 against stoppers 901, 902, and 903 using the swing arms 915 and 916. When substrate 110 is pushed against stoppers 901, 902, and 903, gripper system 730 may grip substrate 110 at a peripheral region along a side of substrate 110. Gripper system 730 may then move along track 735 to move substrate 110 to printhead assembly 125.

Figure 13:
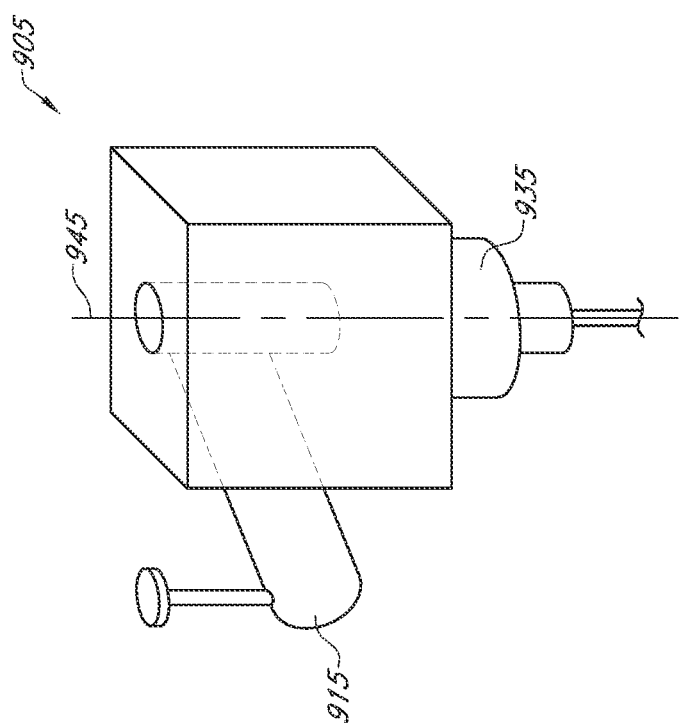
FIG. 13 schematically illustrates a perspective view of a motorized banker, with interior portions shown in dotted line, in accordance with an exemplary embodiment of the present disclosure.

FIG. 13 schematically illustrates an exemplary configuration of motorized banker 905. As shown in the exemplary embodiment of FIG. 13, motorized banker 905 includes swing arm 915 that is rotatable about an axis 945. Axis 945 can be a generally central axis of motorized banker 905, or may be off set from a central axis of the motorized banker 905. Motorized banker 905 may include a motor 935 configured to drive a shaft inside motorized banker 905. Swing arm 915 can be operably coupled to the motorized shaft thereby causing rotation of swing arm 915 based on driving of the shaft. In some embodiments, motor 935 may not be an integral part of motorized banker 905, and may be separate from motorized banker 905.

Figure 10:
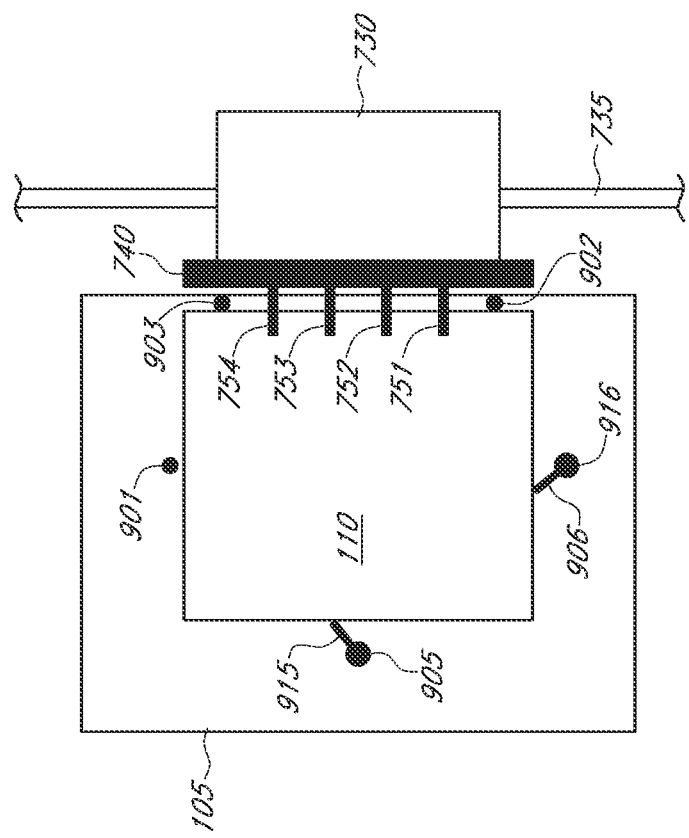
FIG. 10 schematically illustrates a top plan view of the system components shown in FIG. 9.

Referring to FIG. 10, a schematic top view of a portion of system 100 of FIG. 9 is shown, in which motorized bankers 905 and 906 are used to perform the banking process. At the position shown in FIG. 10, swing arm 915 of motorized banker 905 and swing arm 916 of motorized banker 906 engage the edges of substrate 110 to translate the substrate 110 such that it abuts against stoppers 901, 902, and 903. In the position abutting against stoppers 901, 902, 903, gripping devices 751, 752, 753, and 754 of gripping mechanism 740 grip a peripheral region along an edge of substrate 110. After gripper system 730 grips substrate 110, stoppers 901, 902, and 903 may retract into the openings that house stoppers 901, 902, and 903, so that they do not interfere with the conveyance of substrate 110 by gripper system 730. Motorized bankers 905 and 906 may also retract into openings housing motorized bankers 905 and 906, respectively, such that they do not interfere with the loading of another substrate onto floatation table 105, and/or the conveyance of another substrate into an area close to gripper system 730 for performing a banking process.

Figure 11:
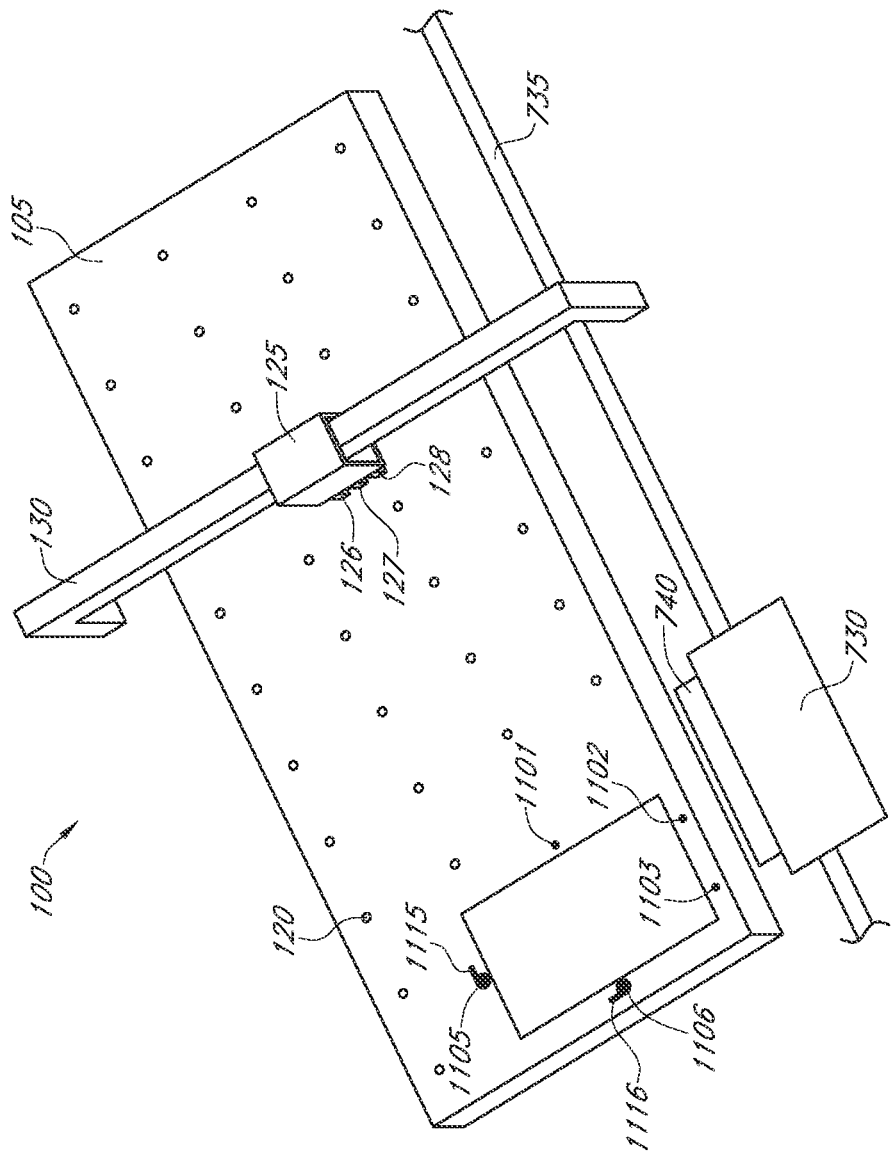
FIG. 11 schematically illustrates a top plan view of the system components of FIG. 9 but with a substrate in a landscape orientation (substrate rotated 90 degrees relative to orientation of the substrate in FIG. 9).

FIGS. 7, 9, and 10 illustrate substrate 110 being loaded onto floatation table 105 in a first (e.g., portrait) orientation. FIG. 11 illustrates that substrate 110 may also be loaded onto floatation table 105 in a second (e.g., landscape) orientation that can be perpendicular to the first orientation. To handle substrate 110 loaded in a landscape orientation, different motorized bankers and/or stopper arrangements may be used. For example, system 100 may further include a first stopper 1101, a second stopper 1102, and a third stopper 1103. Second and third stoppers 1102 and 1103 may be disposed along a side of floatation table 105 where gripper system 730 is located. The locations of first stopper 1101, second stopper 1102, and third stopper 1103 may be different from the locations of first stopper 901, second stopper 902, and third stopper 903. System 100 may include a first motorized banker 1105 having a first swing arm 1115, and a second motorized banker 1106 having a second swing arm 1116. The location of the first motorized banker 1105 and the location of the second motorized banker 1106 may be different from the locations of the first motorized banker 905 and second motorized banker 906.

Figure 12:
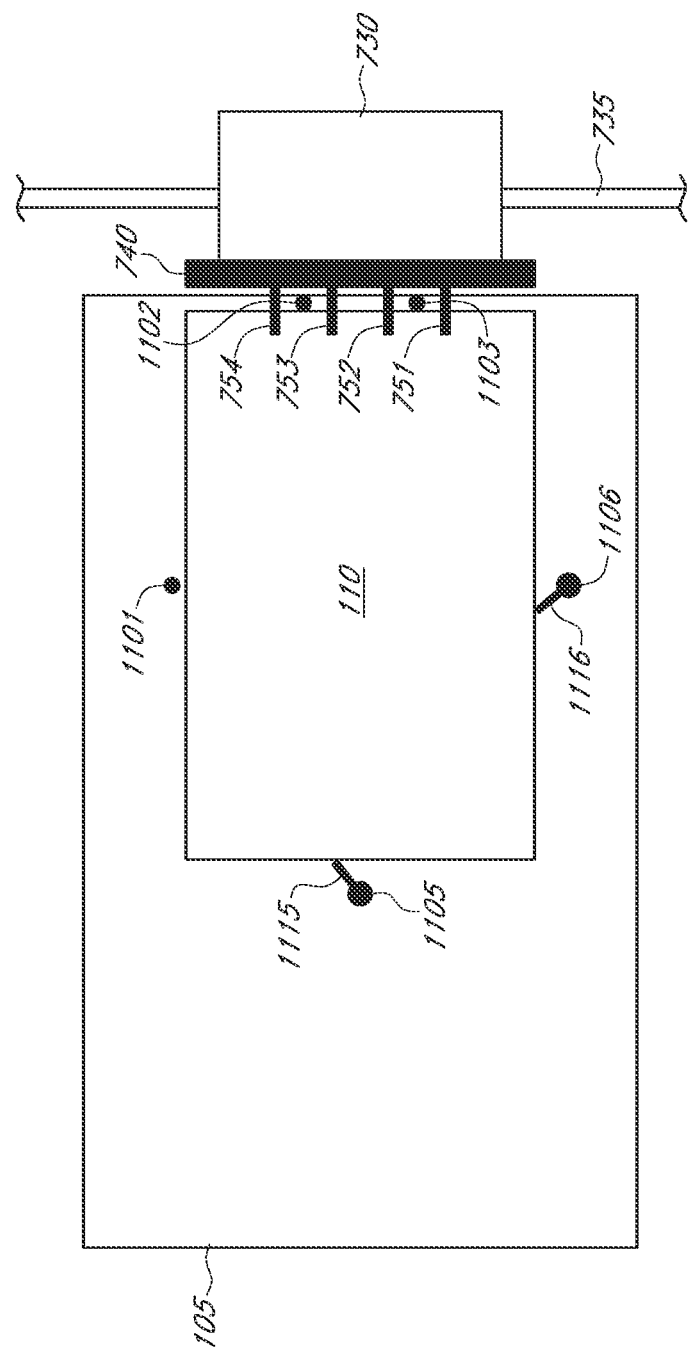
FIG. 12 schematically illustrates a top plan view of the system components shown in FIG. 11.

FIG. 12 schematically illustrates a top view of a portion of system 100 of FIG. 11. In the position, substrate 110 has been translated so as to abut against stoppers 1101, 1102, and 1103 using swing arms 1115 and 1116 of motorized bankers 1105 and 1106 in a manner similar to that described above with reference to FIG. 10. Once the substrate abuts the stoppers 1101, 1102, 1103, gripping devices 751, 752, 753, and 754 grip substrate 110 at a peripheral region along an edge of substrate 110. Gripper system 730 can then move substrate 110 along floatation table 105 and relative to the printhead assembly (not shown) as gripper system 730 moves along track 735. After substrate 110 is gripped, stoppers 1101, 1102, and 1103 may be retracted into openings that house stoppers 1101, 1102, and 1103 so that they do not interfere with movement of substrate 110. Motorized bankers 1105 and 1106 may also retract into openings that house motorized bankers 1105 and 1106 so that they do not interfere with loading or conveyance of another substrate onto floatation table 105 for performing the banking process.

Figure 14:
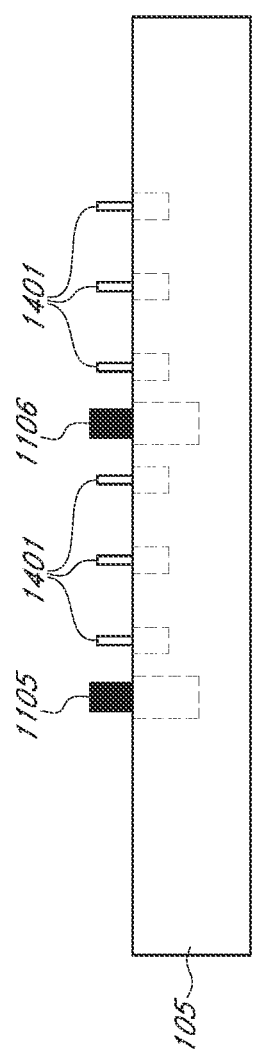
FIG. 14 schematically illustrates a side view of a portion of the floatation table shown in FIG. 12.

There are various challenges that can arise when using motorized bankers to perform the banking process. One of the challenges relates to the difficulty in the placement of lifting pins when motorized bankers are used. FIG. 14 schematically illustrates a side view of a portion of floatation table 105 shown in FIG. 12. When motorized bankers 1105 and 1106 are used, they are disposed at fixed locations on floatation table 105. Floatation table 105 may also include a plurality of lifting pins 1401 configured to support substrate 110 when substrate 110 is loaded onto floatation table 105 by end effector 761 of robotic arm 760 shown in FIG. 7. When in use, motorized bankers 1105 and 1106 extend out from openings in floatation table 105. Thus, motorized bankers 1105 and 1106 protrude out from surface 115 of floatation table 105.

Figure 15:
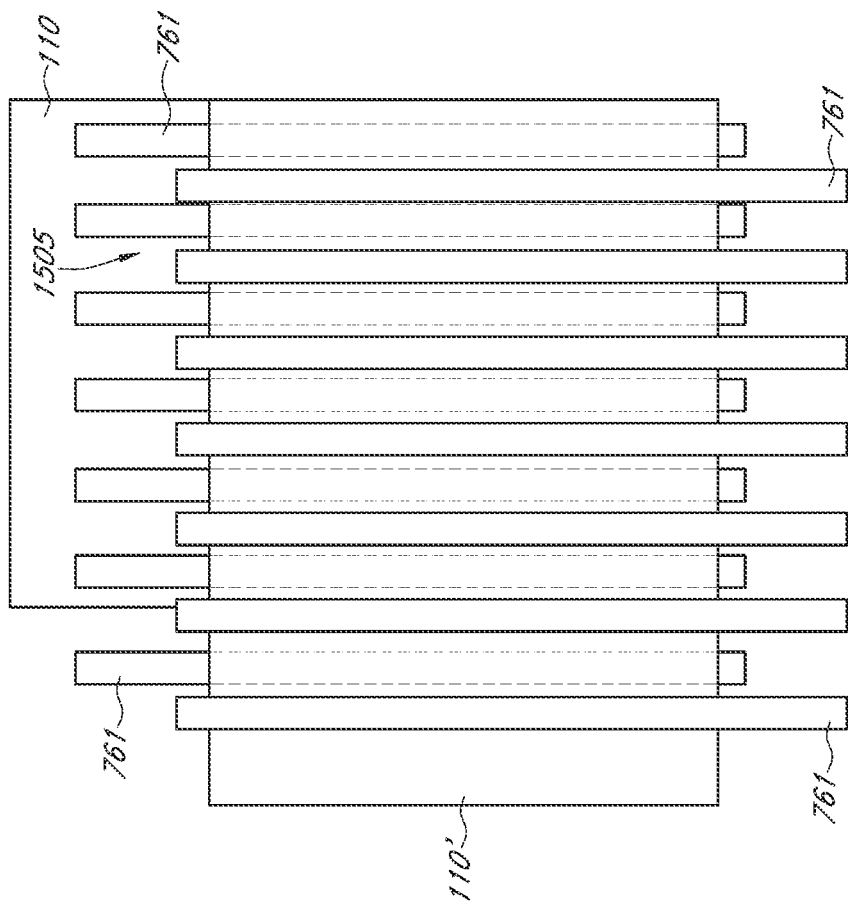
FIG. 15 illustrates positions of an end effector when loading a substrate in a portrait orientation and loading a substrate in a landscape orientation in accordance with an exemplary embodiment of the present disclosure.
Figure 16:
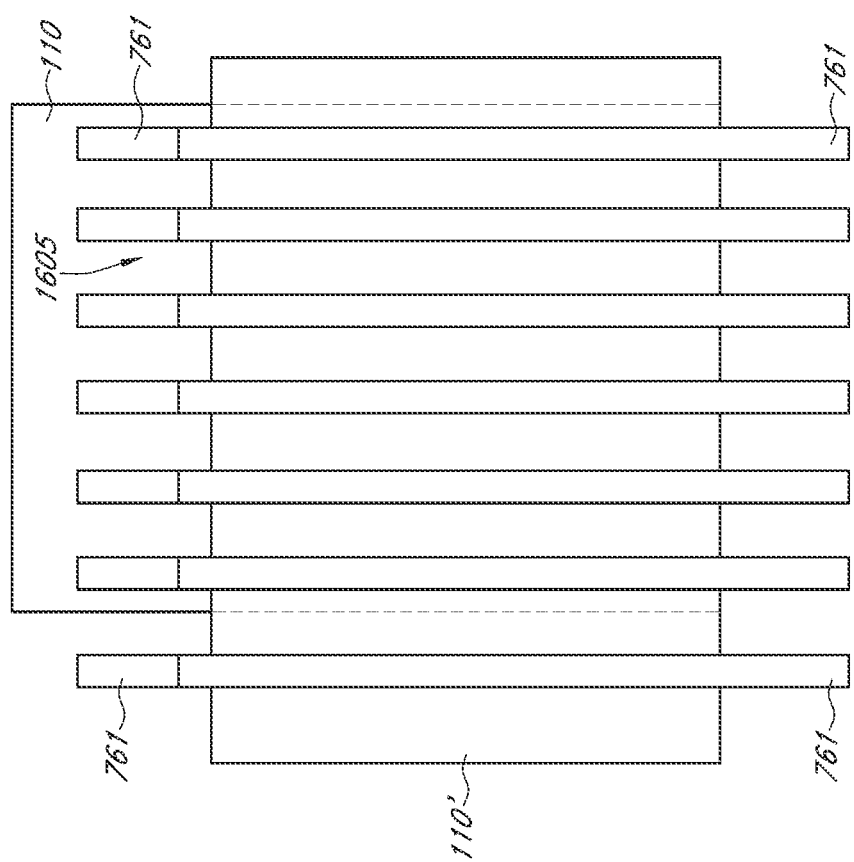
FIG. 16 illustrates positions of an end effector when loading a substrate in a portrait orientation and loading a substrate in a landscape orientation, onto a floatation table in accordance with an exemplary embodiment of the present disclosure.

FIG. 15 illustrates positions of end effector 761 when loading substrate 110 in a portrait orientation and loading a substrate 110' (of the same size as substrate 110) in a landscape orientation, onto floatation table 105, when motorized bankers are used for performing the banking process. FIG. 15 illustrates the difficulty in placement of the lifting pins created by using motorized bankers. FIG. 16 illustrates positions of end effector 761 when loading substrate 110 in a portrait orientation and when loading substrate 110' in a landscape orientation, onto floatation table 105, when air bankers in accordance with various disclosed exemplary embodiments are used for performing the banking process. The term air banker(s) as used herein refers to the various exemplary embodiments discussed above that are configured to direct a flow of gas, not limited to air, in a direction forming an acute angle α relative to a surface (such as surface 115), as shown, for example, in FIGS. 2-6. In both FIGS. 15 and 16, two positions of the end effector 761 when loading substrates 110 and 110' at two different loadings are superimposed for illustrative purposes.

As shown in FIG. 15, when motorized bankers are used, they may interfere with the positioning of lift pins. FIG. 15 illustrates the positions of end effector 761 when it is used to load a substrate 110 in the portrait orientation and another substrate 110' in the landscape orientation. As shown in FIG.

15, end effector 761 may include a plurality of forks. Due to the fixed positions of the motorized bankers 1105 and 1106, and the fixed swing distance of the swing arms of motorized bankers 1105 and 1106, the right edges (the edges closer to gripper system 730) of substrate 110 and substrate 110' have to be aligned at the same position (as shown in FIG. 15, the right edges are aligned with one another) when substrates 110 and 110' are loaded onto floatation table 105, such that the swing arms of motorized banker 1105 and 1106 can push substrates 110 and 110' to move a same distance to reach stoppers, thereby allowing the gripping devices of gripper system 730 to grip the substrates at the peripheral regions. As a result, the forks of end effector 761 are not at the same positions (as shown in FIG. 15, the forks of end effector 761 do not overlap each other) when loading substrate 110 and when loading substrate 110'. The offset between the forks when loading the portrait-oriented substrate 110 and when loading the landscape-oriented substrate 110' reduces the gap 1505 available for placing lifting pins. Thus, when motorized bankers are used, designing a floatation table with lift pins can pose challenges and increase complexity in the design.

Another challenge associated with using motorized bankers relates to the mura phenomenon discussed above. Relatively large openings in floatation table 105 may be needed to at least partially house the motorized bankers when they are retracted and not used. The openings for housing and retraction of motorized bankers are larger than those for housing the lifting pins and/or those for providing gas bearing to float substrate 110. When substrate 110 printed with materials on an upper surface is moved over the large openings that house motorized bankers, for example, during the printing process, an increased risk of mura phenomenon may occur due to the thermal variations under the substrate relating to the larger sized openings.

Other challenges associated with using motorized bankers may relate to the lack of flexibility for system 100. Motorized bankers have a limited swing stroke (i.e., the distance the swing arm can push substrate). Thus, the motorized bankers are typically placed at predetermined locations on floatation table 105. The locations of the motorized bankers may depend on the size of the substrate. Thus, when using motorized bankers, system 100 does not have flexibility to handle substrates of different sizes.

In contrast, the use of air bankers in accordance with various exemplary embodiments of the present disclosure alleviate or eliminate the various challenges associated with motorized bankers. For example, as shown in FIG. 16, when air bankers in accordance with any of the various exemplary embodiments described above are used to perform the banking process, the distance air bankers can push substrates to move need not be limited or fixed because air bankers can be placed in various positions covering a relatively wide range of the area underneath the substrate, thus allowing for continued conveyance (translation and/or rotation) of the substrate as it moves relative to the air bankers. In addition, air bankers can be "hidden" in the openings at the surface of a floatation table, and do not protrude beyond the surface (e.g., surface 115), which eliminates interference issues described above. When end effector 761 places substrates 110 and 110' onto floatation table 105, the right edges of substrates 110 and 110' do not need to be at the same position. Thus, as end effector 761 loads substrate 110' onto floatation table 105, end effector 761 can move to a same location on floatation table 105 as in its previous loading, regardless of orientation of the substrate. Therefore, forks of end effector 761 may always fall at the same or substantially the same locations, as illustrated by the overlapping of the forks in FIG. 16. Thus, when using air bankers, forks of end effector 761 will not interfere with the lifting pins, which may be positioned in the gaps 1605 between the forks.

Using air bankers also reduces the mura phenomenon. For the same distance of pushing the substrate, the openings for the air bankers may be much smaller than the openings housing the motorized bankers. As a result, the mura effect may be reduced when air bankers are used. Moreover, because air bankers are not limited to the distance they can push substrates, and because when in use, air bankers do not protrude out of surface 115 of floatation table 105, the location and the number of the air bankers can be flexible. Therefore, system 100 may be flexibly configured to handle substrates of various sizes and shapes.

FIG. 17A illustrates an application of air bankers for performing the banking process, in accordance with the disclosed embodiments. FIG. 17A shows that a single air banker 1710 is used. The single air banker 1710 may be disposed in the table such that it is under a central region of the substrate, as shown in FIG. 17A. As disclosed herein, the air banker 1710 may be realized using the angled opening 202 shown in FIG. 2, or may be realized using a nozzle having an adjustable nozzle head, as discussed above and as shown in FIGS. 3-6. Air banker 1710 provides a flow of a gas in a direction 1720 in the x-y plane (i.e., in the plane parallel to surface 115) to push substrate 110 to move toward and against stoppers 1701, 1702, and 1703. The direction 1720 may form an angle β with respect to the x-axis, as shown in FIG. 17B. When air banker 1710 is realized using a nozzle with an adjustable nozzle head, the nozzle head may be rotated to change the pointing direction (x-y orientation), thereby changing the direction 1720 and the angle β. The angle β may be in the range of 0° to 90°. In some embodiments, the angle β may be in the range of 0° to 30°, 30° to 45°, or 45° to 90°. The angle β may be adjusted by adjusting the adjustable nozzle head. In some embodiments, the angle β may be manually adjusted by manually adjusting the nozzle head. In some embodiments, the angle β may be automatically and dynamically adjusted by adjusting the nozzle head using the controllers and motors, as disclosed above. Once substrate 110 is pushed against stoppers 1701, 1702, and 1703, gripper system 730 can grip a peripheral region of substrate 110 using gripping devices 751, 752, 753, and 754 of gripping mechanism 740.

FIG. 18A illustrates another application of air bankers for performing the banking process, in accordance with the disclosed embodiments. FIG. 18A shows that two air bankers 1810 and 1830 are used. Each of the air bankers 1810 and 1830 may be realized using either the angle passage 202, or the nozzle with an adjustable nozzle head, as disclosed herein. Air bankers 1810 and 1830 may be configured to provide two gas flows to push substrate to move toward and against stoppers 1701, 1702, and 1703. First air banker 1810 may be configured to provide a first gas flow in a first direction 1820, and second air banker 1830 may be configured to provide a second gas flow in a second direction 1840. As shown in FIG. 18B, first direction 1820 and second direction 1840 may form an angle γ. The angle γ may be in the range of 0° to 180°. In some embodiments, the angle γ may be in the range of 0° to 30°, 30° to 45°, 45° to 90°, 90° to 120°, 120° to 150°, or 150° to 180°. When adjustable nozzle heads are used for the air bankers, the angle γ may be automatically and dynamically adjusted by adjusting the nozzle heads using the controllers and motors disclosed herein.

Figure 19:
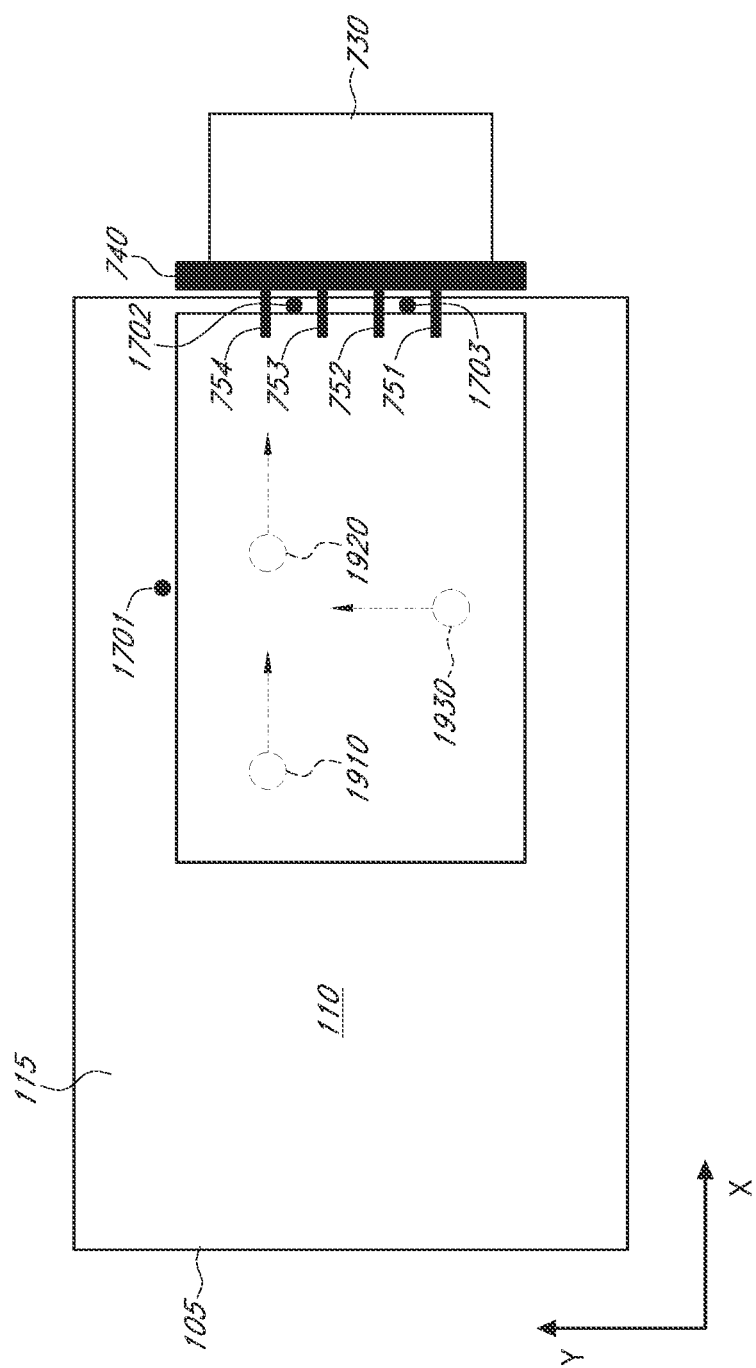
FIG. 19 illustrates a top plan view of printing system components and banking of a substrate in accordance with another exemplary embodiment of the present disclosure.

FIG. 19 illustrates another application of air bankers for performing the banking process, in accordance with the disclosed embodiments. FIG. 19 shows that three air bankers 1910, 1920, and 1930 are used. Each of the air bankers may be similar to the air bankers discussed above. Air bankers 1910, 1920, and 1930 may be configured to push substrate 110 against stoppers 1701, 1702, and 1703, before gripper system 730 grips substrate 110. First air banker 1910 may be configured to provide a first flow of gas in a first direction, second air banker 1920 may be configured to provide a second flow of gas in a second direction, and third air banker 1930 may be configured to provide a third flow of gas in a third direction. When nozzles with adjustable nozzle heads are used to realize air bankers 1910, 1920, and/or 1930, the nozzle heads may be rotated to change the first, second and third directions of the first, second, and third flows of gas.

Figure 17:
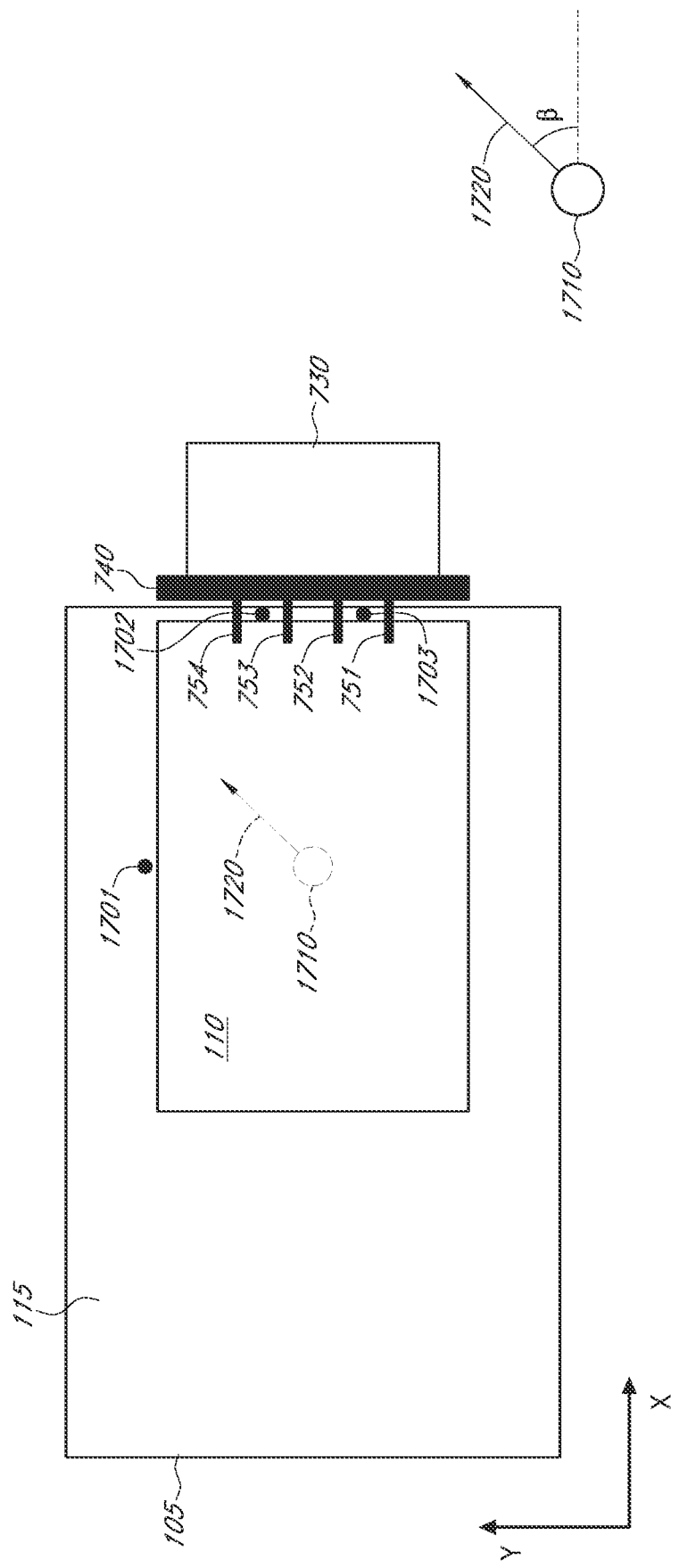
FIG. 17A illustrates a top plan view of printing system components and banking of a substrate in accordance with an exemplary embodiment of the present disclosure.
FIG. 17B schematically depicts an angle formed by the direction of the flow of the second gas from the floatation table of FIG. 17A for conveying the substrate with respect to an x-axis, in accordance with an exemplary embodiment of the present disclosure.
Figure 18:
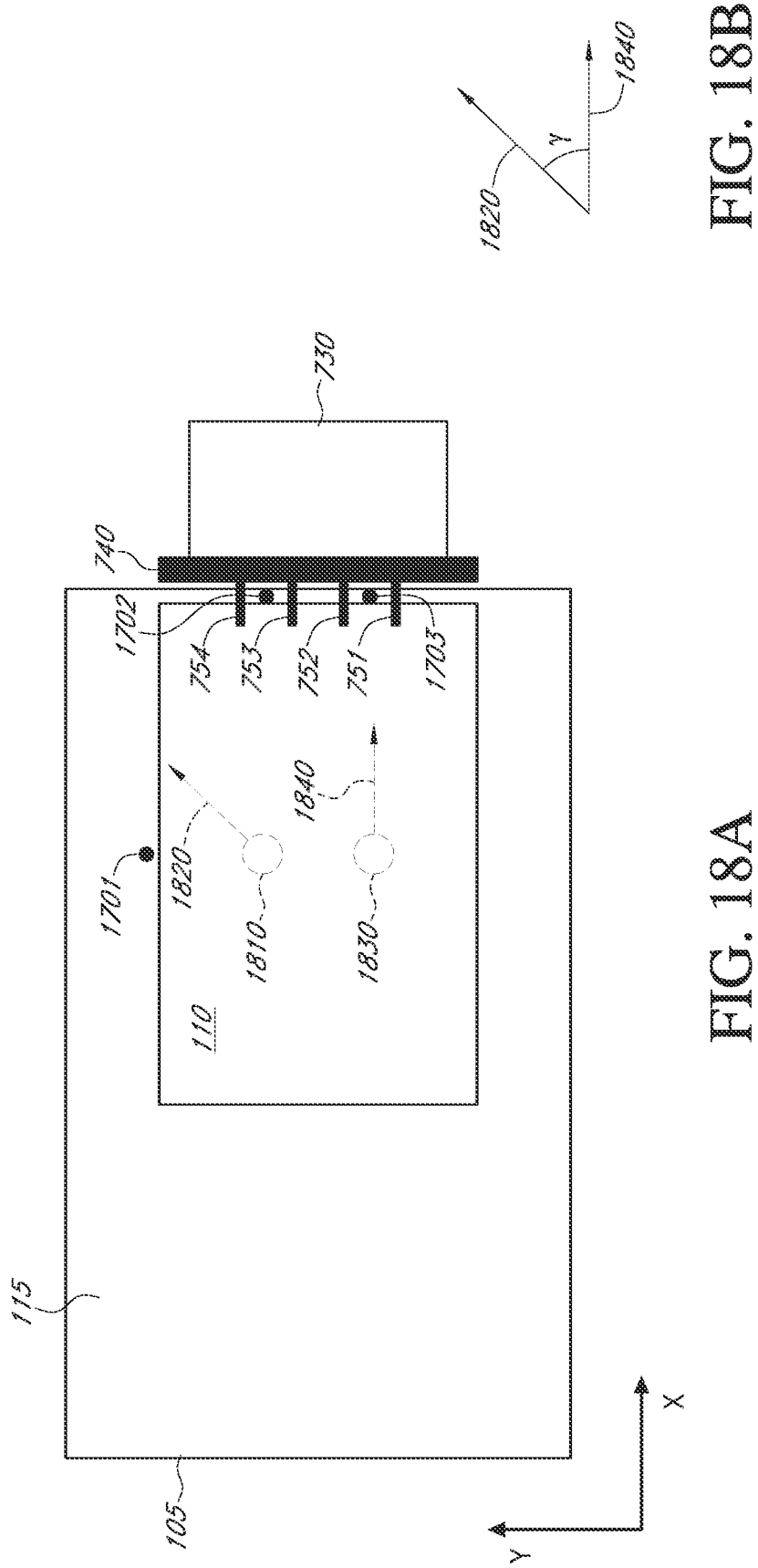
FIG. 18A illustrates a top plan view of printing system components and banking of a substrate in accordance with another exemplary embodiment of the present disclosure.
FIG. 18B schematically depicts an angle formed by the direction of the flow of the second gas from the floatation table of FIG. 18A for conveying the substrate with respect to an x-axis, in accordance with an exemplary embodiment of the present disclosure.

In the various exemplary embodiments of FIGS. 17-19, the substrates may be floatingly supported with the use of perpendicular passages and gas flow from the floatation table 105 while the air banking process is occurring using the air bankers. Alternatively, the air bankers may provide a sufficient gas flow alone to both float and convey the substrate.

FIG. 20 illustrates an embodiment of a floatation table configured for providing floatation of a substrate and devices that are separate from the floatation table to provide conveyance (e.g., translation) of the substrate, in accordance with an exemplary embodiment. The floatation table 105 shown in previous figures is comprised of an integral piece. For example, floatation table 105 may include a single plate structure (monolithic or integrally joined portions) having a plurality of passages in the plate, as shown in FIG. 1. In the embodiments shown in previous figures, passages (including angled passages or nozzles with adjustable nozzle heads) configured to provide conveyance (e.g., translation) of substrate 110 may be disposed in floatation table 105. In the embodiment shown in FIG. 20, a floatation table 2000 includes a plurality of segments that are separate from one another and spaced by a gap. For example, floatation table 2000 may include a first segment 2001, a second segment 2002, and a third segment 2003 that are separate from one another with a gap. Each of first segment 2001, second segment 2002, and third segment 2003 may include a plurality of passages 2010 configured to provide a flow of gas to float substrate 110 (not shown in FIG. 20). The passages 2010 may be similar to other passages discussed above for providing floatation. The floatation table 2000 may be used in combination with other components of system 100, such as controllers, control valves, gas supply manifolds, motors, etc.

In the embodiment shown in FIG. 20, various exemplary embodiments of substrate support apparatuses may include devices for providing conveyance (e.g., translation and/or rotation) of substrate 110 that are provided separately from a floatation table 105, and may not form part of an integral structure with the floatation table 105. For example, a plurality of devices 2031, 2032, 2033, 2034, 2035, and 2036 may be provided (e.g., installed, affixed) in the gap between adjacent table segments 2001, 2002, and 2003. The devices 2031-2036 for providing conveyance (e.g., translation and/or rotation) to substrate 110 may be realized using either the angled passages 201, or using the nozzles, e.g., with adjustable nozzle heads, as discussed above. Each device 2031-2036 may be associated with a plate or surface 2041, 2042, 2043, 2044, 2045, and 2046. Gas flowing out of devices 2031-2036 may generate flows between at least surfaces 2041-2046 and a lower surface of substrate 110. In some embodiments, the gas flowing out of devices 2031-2036 may also generate flows between surface 115 and substrate 110. The surfaces 2041-2046 are configured to provide an area needed for generating the drag force. The area of each surface 2041-2046 may be suitably designed such that the drag force generated by the flows of gas from devices 2031-2036 is sufficient to move substrate 110 along floatation table 105.

FIG. 21 illustrates another embodiment of a substrate support apparatus that includes a floatation table for providing floatation to substrates and devices separately provided to provide conveyance (e.g., translation) of substrates, in accordance with the disclosed embodiments. Floatation table 2100 may include a plurality of segments, first segment 2101, second segment 2102, and third segment 2103. Each segment 2101-2103 may be made of a porous or sintered medium comprising passages in the form of pores that allow a gas to flow through to form a gas bearing for floating substrate 110. Devices 2131, 2132, 2133, 2134, 2135, and 2136 may be similar to devices 2031, 2032, 2033, 2034, 2035, and 2036. Surfaces 2141, 2142, 2143, 2144, 2145, and 2146 may be similar to surfaces 2131, 2132, 2133, 2134, 2135, and 2136. The floatation table 2100 may be used in combination with other components of system 100, such as flow control systems, controllers, control valves, gas supply manifolds, motors, pressure regulators, etc.

While various exemplary embodiments shown and described above have air bankers generally directing air in a direction from and away from the surface of a floatation table above which the substrate is supported, the present disclosure also contemplates using air bankers directing flow from above the surface of the substrate facing away from the floatation table. For example, one or more passages, including nozzles, as have been described herein can be positioned to direct the angled flow of gas for conveyance of the substrate toward a side of the substrate opposite the surface of the substrate facing the floatation table. In such a configuration, control of the gas flows for floatation and conveyance may need to be balanced so as to allow for both the floatation and the conveyance of the substrate to occur.

Figure 22:
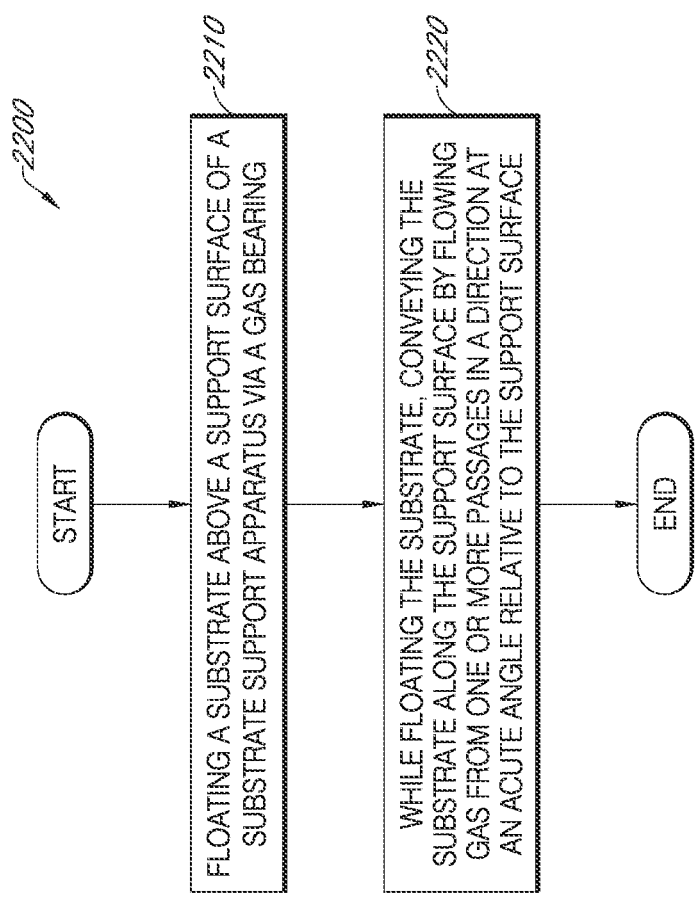
FIG. 22 is a flowchart illustrating exemplary steps of a method for supporting and conveying (e.g., translating) a substrate in accordance with the present disclosure.

FIG. 22 is a flowchart illustrating an exemplary method for supporting and conveying (e.g., translating) a substrate, in accordance with various disclosed exemplary embodiments. In an exemplary embodiment, it is contemplated that method 2200 can be performed in conjunction with a processor or controller operably coupled to control the operation of system 100. For example, method 2200 may be performed by any of controllers 241, 242, 371, 372, 461, 462, 561, 562, 651, 851, and 852, or any combination thereof. In some exemplary embodiments, method 2200 may be performed by an overall system controller that may include one or more of controllers 241, 242, 371, 372, 461, 462, 561, 562, 651, 851, and 852. In some exemplary embodiments, method 2200 may be performed by a processor or controller that is separate from controllers 241, 242, 371, 372, 461, 462, 561, 562, 651, 851, and 852.

Action 2210 of exemplary method 2200 includes floating a substrate above a support surface of a substrate support apparatus via a gas bearing. For example, in the embodiment of FIG. 2, first controller 241 may control first control valve 231 to supply a first gas from gas source 260 to first gas supply manifold 221. First gas supply manifold 221 may distribute the first gas to a plurality of first passages 201 to establish a gas bearing between surface 115 of floatation table 105 and a lower surface of substrate 110. The first gas may flow out of first passages 201 in a direction that is substantially perpendicular to surface 115 of floatation table 105. Substrate 110 may be floated above surface 115 via the gas bearing. First controller 241 may control first control valve 231 and/or a pressure regulator of the flow control system to adjust the pressure and/or flow rate of the first gas such that the gas bearing is sufficient to float substrate 110.

In the embodiment of FIG. 3, first controller 371 may control first control valve 361 to supply a first gas from gas source 390 to first gas supply manifold 341. First gas supply manifold 341 may distribute the first gas to a plurality of first nozzles 311. First nozzles 311 may have first nozzle heads 321 pointing upward perpendicularly to surface 115 of floatation table 105. First nozzles 311 may direct the first gas to flow out of first nozzle heads 321 in a direction that is substantially perpendicular to surface 115 of floatation table 105. The flows of the first gas may establish a gas bearing between surface 115 and a lower surface of substrate 110, thereby floating substrate 110 above surface 115. First controller 371 may control first control valve 361 and/or a pressure regulator of the flow control system to adjust the pressure and/or flow rate of the first gas, such that the gas bearing is sufficient to float substrate 110.

In the embodiment of FIG. 4, first controller 461 may control first control valve 451 to supply a first gas from gas source 470 to first gas supply manifold 441. First gas supply manifold 441 may distribute the first gas to a plurality of first passages 401. First passages 401 may direct the first gas to flow upward in a direction that may be substantially perpendicular to surface 115. The flows of the first gas may establish a gas bearing between surface 115 and a lower surface of substrate 110, thereby floating substrate 110 above surface 115. First controller 461 may control first control valve 451 and/or a pressure regulator of the flow control system to adjust the pressure and/or flow rate of first gas, such that the gas bearing is sufficient to float substrate 110.

In the embodiment of FIG. 5, first controller 561 and second controller 562 may control the orientation (e.g., rotation) of first nozzle head 521 and second nozzle head 522, such that they point to opposite directions, as shown in FIG. 5. In addition, first controller 561 and second controller 562 may control the pivoting of first nozzle head 521 and second nozzle head 522, such that the gas flows out of first nozzle head 521 and second nozzle head 522 may form the same acute angle α with respect to surface 115. Thus, the drag force in the horizontal direction (i.e., in the plane of surface 115) generated by flows from first nozzle head 521 and second nozzle head 522 may cancel out, leaving only the vertical lifting force components. As a result, a gas bearing may be generated by flows of the first gas and the second gas between surface 115 and a lower surface of substrate 110 to float substrate 110.

In the embodiment of FIG. 20, when floatation table 105 includes a plurality of segments, a controller (e.g., any controller shown in the disclosed figures) may control a supply of a first gas to first openings 2010 (which may or may not include nozzles disposed therein) on each segment. The flows of the first gas out of the first openings 2010 at the plurality of segments may together establish a gas bearing sufficient to float substrate 110.

In the embodiment of FIGS. 21 and 23, when floatation table 105 includes a porous or sintered medium, a controller may control a supply of a first gas to flow from the pores of the table (e.g., the segments in FIG. 21 or the entire table in FIG. 23). The first gas flowed out of the pores of the table may together establish a gas bearing between the surface of the table (or segments of the table) and substrate 110. The gas bearing may be sufficient to float substrate 110.

Referring to FIG. 22, at action 2220, method 2200 includes, while floating the substrate, conveying the substrate along the support surface by flowing gas from one or more passages in a direction at an acute angle relative to the support surface. For example, in the embodiment shown in FIG. 2, second controller 242 may control second control valve 232 and/or a pressure regulator of the flow control system to supply a second gas from gas source 260 to second gas supply manifold 222. Second gas supply manifold 222 may distribute the second gas to a plurality of second passages 202. Second gas flowing out of second passages may be in a direction that forms an acute angle α relative to surface 115 of floatation table 105. Second controller 242 may control second control valve 232 and/or a pressure regulator of the flow control system to adjust the pressure and/or flow rate of the second gas such that the second gas flowing out of second openings 202 may generate a drag force that is sufficient to convey (e.g., translate) substrate 110, such as to translate substrate 110 along surface 115.

In the embodiment of FIG. 3, second controller 372 may control second control valve 362 to supply a second gas from gas source 390 to second gas supply manifold 342. Second gas supply manifold 342 may distribute the second gas to a plurality of second nozzles 312. Second controller 372 may control second motor 332 to adjust the pivoting angle of second nozzle head 322 relative to surface 115, such that the second gas flowing out of second nozzle head 322 may be in a direction that forms an acute angle α relative to surface 115. Second controller 372 may control second control valve 362 and/or a pressure regulator of the flow control system to adjust the pressure and/or flow rate of the second gas supplied to second nozzle 312, such that the second gas flowing out of second nozzle head 322 may generate a drag force in the plane of surface 115 that is sufficient to convey (e.g., translate) substrate 110. Second controller 372 may also control second motor 332 to rotate second nozzle head 322, such that the second nozzle head 322 may point to a desired direction, thereby affecting the travel direction of substrate 110.

In the embodiment of FIG. 4, second controller 462 may control second control valve 452 to supply a second gas from gas source 470 to second gas supply manifold 442. Second gas supply manifold 442 may distribute the second gas to a plurality of second nozzles 412. Second controller 462 may control second motor 432 to adjust the pivoting angle of second nozzle head 422 relative to surface 115, such that the second gas flowing out of second nozzle head 422 may be in a direction that forms an acute angle α relative to surface 115. Second controller 462 may control second control valve 452 and/or a pressure regulator of the flow control system to adjust the pressure and/or flow rate of the second gas supplied to second nozzle 412, such that the second gas flowing out of second nozzle head 422 may generate a drag force in the plane of surface 115 that is sufficient to convey (e.g., translate) substrate 110. Second controller 462 may also control second motor 432 to rotate second nozzle head 422, such that the second nozzle head 422 may point to a desired direction, thereby affecting the travel direction of substrate 110.

In the embodiment of FIG. 5, first controller 561 and second controller 562 may control first control valve 551 and second control valve 552, respectively, and/or a pressure regulator of the flow control system to supply a first gas and a second gas from gas source 570 to first gas supply manifold 541 and second gas supply manifold 542, respectively. First gas supply manifold 541 may distribute the first gas to a plurality of first nozzles 511, and second gas supply manifold 542 may distribute the second gas to a plurality of second nozzles 512. First controller 561 may control first motor 531 to rotate first nozzle head 521. First controller 561 may also control first motor 531 to pivot first nozzle head 521 relative to surface 115 to change the acute angle α formed between the first gas flowing out of first nozzle head 521 and surface 115. Second controller 562 may control second motor 532 to rotate second nozzle head 522. Second controller 562 may also control second motor 532 to pivot second nozzle head 522 relative to surface 115 to change the acute angle α formed between the second gas flowing out of second nozzle head 522 and surface 115. First controller 561 may control first control valve 551 and/or a pressure regulator of the flow control system to adjust the pressure and/or flow rate of the first gas supplied to first nozzle 511, and second controller 562 may control second control valve 552 and/or a pressure regulator of the flow control system to adjust the pressure and/or flow rate of the second gas supplied to second nozzle 512. With suitable orientation of first nozzle heads 511 and second nozzle heads 512, and suitable pressures and/or flow rates, the drag force generated by flows of first gas and flows of second gas between surface 115 and substrate 110 may not cancel out. The remaining drag force may be sufficient to convey (e.g., translate) substrate 110 along surface 115. For example, first nozzles 511 and second nozzles 512 may be rotated to point to opposite directions, as shown in FIG. 5, and the acute angle α for the first nozzle heads 521 and second nozzle heads 522 may be adjusted to be the same. The pressure and/or flow rate of the first gas may be different from the pressure and/or flow rate of the second gas, which may result in a non-zero drag force remaining in the horizontal direction along surface 115 shown in FIG. 5. The drag force may be sufficient to convey (e.g., translate) substrate along surface 115.

In the embodiment of FIG. 20, devices 2031, 2032, 2033, 2034, 2035, and 2036 may include a passage similar to second passages 202, or may include nozzles similar to nozzles 312, 412, 511, 512, and 611. A controller (e.g., any controller disclosed herein) may control the pressure and/or flow rate of a second gas supplied to devices 2031, 2032, 2033, 2034, 2035, and 2036. The controller may also adjust the orientation (e.g., rotation angle and/or pivoting angle) of the nozzles included in devices 2031, 2032, 2033, 2034, 2035, and 2036. As a result, the controller may control the devices 2031, 2032, 2033, 2034, 2035, and 2036 to provide flows of a second gas at least between surfaces 2041, 2042, 2043, 2044, 2045, and 2046, and a lower surface of substrate 110. The flows may generate a drag force sufficient to convey (e.g., translate) substrate 110 along surface 115.

In the embodiment of FIG. 21, devices 2131, 2132, 2133, 2134, 2135, and 2136 may include a passage similar to second passages 202, or may include nozzles similar to nozzles 312, 412, 511, 512, and 611. A controller (e.g., any controller disclosed herein) may control the pressure and/or flow rate of a second gas supplied to devices 2131, 2132, 2133, 2134, 2135, and 2136. The controller may also adjust the orientation (e.g., rotation angle and/or pivoting angle) of the nozzles included in devices 2131, 2132, 2133, 2134, 2135, and 2136. As a result, the controller may control the devices 2131, 2132, 2133, 2134, 2135, and 2136 to provide flows of a second gas at least between surfaces 2141, 2142, 2143, 2144, 2145, and 2146, and a lower surface of substrate 110. The flows may generate a drag force sufficient to convey (e.g., translate) substrate 110 along surface 115.

The disclosed conveying system for conveying the substrate may be implemented using other techniques. For example, a plurality of vacuum ports may be provided in a floatation table or separately provided within gaps between segments of a floatation table. The vacuum ports may create a vacuum drawing force, thereby drawing air or gas in a direction in the space formed between a surface (e.g., support surface 115) and a lower surface of the substrate. While air or gas is drawn in a certain direction by the vacuum ports, substrate may be moved along the surface. To direct gas flows, rather or in addition to using angled passages, it is contemplated that vanes, blades, paddle wheels or other similar devices to direct gas flows can be situated in passages to orient gas flow as desired. Such flow direction devices may be adjustable and controllable via a controller. Those having ordinary skill in the art would appreciate how to implement such devices to achieve the desired orientation of gas flows based on the operational principles disclosed herein.

Aspects of the present disclosure contemplate various systems, methods, and devices for using floatation to convey and support substrates, for example, during processing, such as printing or otherwise treating substrates to be used for displays and other applications. An embodiment contemplates a system comprising a printing system including a printhead assembly arranged to dispense a material for deposition onto a substrate. The system also includes a substrate support apparatus having a support surface, the substrate support apparatus including a plurality of first passages arranged to distribute flows of a first gas to establish a gas bearing to float the substrate above the support surface; and a conveyance system including a plurality of second passages arranged to distribute flows of a second gas relative to the support surface so as to convey the substrate along the support surface.

Various additional embodiments of the system include one or more of the following aspects. The system wherein the second passages of the conveyance system are integral with the support surface of the substrate support apparatus. The system wherein the support surface includes a plurality of segments separated from one another by one or more gaps, and the second passages of the conveyance system include a plurality of nozzles disposed in the one or more gaps between the segments. The system wherein the first passages are arranged to distribute the flows of the first gas in a direction perpendicular to the support surface. The system wherein the second passages are arranged to distribute the flows of the second gas in a direction forming an acute angle relative to the support surface. The system wherein the plurality of first passages includes a plurality of first nozzles to distribute the flows of the first gas, and the plurality of second passages includes a plurality of second nozzles to distribute the flows of the second gas. The system wherein the first nozzles are arranged to distribute the flows of the first gas in a direction perpendicular to the support surface, and the second nozzles are arranged to distribute the flows of the second gas in a direction forming an acute angle relative to the support surface. The system wherein the second nozzles are disposed at a non-peripheral region of the floatation table. The system wherein the plurality of second passages includes a plurality of nozzles, the nozzles configured to distribute the flows of the second gas in a direction forming an acute angle relative to the support surface. The system wherein the plurality of first passages includes a plurality of nozzles to distribute the flows of the first gas to float the substrate, where the second passages are angled relative to the support surface so as to distribute the flows of the second gas in a direction forming an acute angle relative to the support surface. The system where the plurality of first passages includes a plurality of first nozzles, and where the plurality of second passages includes a plurality of second nozzles, each of the first nozzles and the second nozzles having a nozzle head that is pivotable relative to the support surface and rotatable relative to an axis of the nozzle head normal to the support surface. The system further including one or more controllers each configured to adjust at least one of a pivoting angle and a rotating angle of the nozzle head. The system further including one or more motors, where each of the first nozzles and the second nozzles is coupled to the one or more motors, and where the one or more motors are controllable by the one or more controllers to adjust at least one of the pivoting angle and the rotating angle of the nozzle head. The system where the one or more controllers are configured to adjust the first nozzles to distribute the flows of the first gas in a direction perpendicular to the support surface, and to adjust the second nozzles to distribute the flows of the second gas in a direction forming an acute angle relative to the support surface. The system where the acute angle is about 5 degrees to 30 degrees relative to the support surface. The system where the acute angle is about 30 degrees to 45 degrees relative to the support surface. The system where the flows of the first gas are at different pressures than the flows of the second gas. The system where the flows of the first gas are at different flow rates than the flows of the second gas. The system further including a gas source configured to provide the first gas and the second gas. The system further including first valves operably coupled to the first passages and second valves operably coupled to the second gas flow passages, where the first valves and the second valves are coupled to one or more controllers and are independently controlled by the one or more controllers to adjust at least one of pressures and flow rates of the first gas and the second gas. The system wherein the substrate support apparatus includes a porous medium, and the first passages include pores of the porous medium. The system wherein the second passages are chosen from channels, throughholes, nozzles, or a combination thereof. The system further including at least one controller configured to control the flows of the second gas to provide pulses of the second gas to translate the substrate. The system including a track disposed along the floatation table and a gripper system mounted on the track and movable along the track, the gripper system including a gripping device configured to grip the substrate. The system wherein the gripper system is configured to move along the track while gripping the substrate to transport the substrate along the substrate support apparatus to a printing zone having the printing system. The system wherein the printhead assembly is configured to deposit an organic material for forming an OLED device. The system wherein the printing system includes an inkjet printer having at least one inkjet printhead configured to print an organic material. The system wherein the gripper system is configured to move along the track to position the substrate while the organic material is deposited onto different regions of the substrate. The system further including a plurality of stoppers disposed adjacent the gripper system, where the second passages are configured to distribute the flows of the second gas to move the substrate toward and against the stoppers, and where the gripper system is configured to grip the substrate at a peripheral region of the substrate after the substrate is stopped by the stoppers. The system further including retractable lift pins, wherein the lift pins are configured to extend out from a surface of the substrate support apparatus to support the substrate after the substrate is loaded onto the substrate support apparatus. The system wherein the retractable lift pins are configured to retract below the surface of the substrate support apparatus. The system wherein the first gas and the second gas are a same gas. The system wherein the first gas and the second gas are different from each other.

Another embodiment contemplates a system comprising a support surface. The system also includes a plurality of first passages arranged in the support surface to distribute flows of a first gas to establish a gas bearing to float the substrate above the support surface. The system also includes a plurality of second passages arranged to distribute flows of a second gas relative to the support surface so as to convey the substrate along the support surface.

Various additional embodiments of the above system include the following aspects. The system wherein the first passages and the second passages are integral with the support surface. The system wherein the first passages are integral with the support surface, and the second passages are separate from the support surface. The system wherein the second passages are arranged to distribute the flows of the second gas in a direction forming an acute angle relative to the support surface. The system where the first gas and the second gas are a same gas. The system wherein the first gas and the second gas are different from each other. The system wherein the support surface is made of a porous or sintered material, and where the first passages are pores of the material. The system wherein the second passages include ports formed in the support surface. The system wherein the second passages are chosen from channels, throughholes, nozzles, or a combination thereof. The system wherein the plurality of second passages are arranged to distribute flows of a second gas in a direction away from the support surface toward the substrate.

Another embodiment of the present disclosure contemplates a method comprising floating a substrate above a support surface of a substrate support apparatus via a gas bearing. The method also includes while floating the substrate, conveying the substrate along the support surface by flowing gas toward a surface of the substrate and in a nonperpendicular direction relative to the surface of the substrate.

Various additional embodiments of the method include one or more of the following aspects.

The method further including supplying a first gas for forming the gas bearing and a second gas for conveying the substrate, where the first gas and the second gas are supplied at different pressures. The method further including gripping, using a gripper system mounted on a track, the substrate at a peripheral region of the substrate when the substrate is pushed against stoppers disposed adjacent the gripper system. The method further including forming the gas bearing by flowing gas in a direction perpendicular to and away from the support surface toward the substrate. The method wherein the first gas and the second gas are a same gas. The method wherein the first gas and the second gas are different from each other.

Implementations of the described techniques, systems, and methods according to various embodiments may further include hardware and/or or computer software on a computer-accessible medium with programming instructions and control logic to implement various aspects.

The exemplary systems and methods described herein may be performed under the control of a processor or controller executing computer-readable codes embodied on a computer-readable recording medium or communication signals transmitted through a transitory medium. The computer-readable recording medium may be any data storage device that may store data readable by a processor or controller, and may include both volatile and nonvolatile media, removable and non-removable media, and various other network devices.

Examples of the computer-readable recording medium include, but are not limited to, read-only memory (ROM), random-access memory (RAM), erasable electrically programmable ROM (EEPROM), flash memory or other memory technology, holographic media or other optical disc storage, magnetic storage including magnetic tape and magnetic disk, and solid-state storage devices. The computer-readable recording medium may also be distributed over network-coupled computer systems so that the computer-readable code is stored and executed in a distributed fashion. The communication signals transmitted through a transitory medium may include, for example, modulated signals transmitted through wired or wireless transmission paths.

Devices manufactured using embodiments of the devices, systems, and methods of the present disclosure may include, for example and without limitation, electronic displays or display components, printed circuit boards, or other electronic components. Such components may be used in, for example, handheld electronic devices, televisions or computer displays, or other electronic devices incorporating display technologies. While various exemplary embodiments described the air banking systems and devices as part of a printing system, such a system is not limiting and the air banking and/or floatation devices described can be components in a variety of settings and applications, such as for example, for general conveyance of substrates.

It is to be understood that the examples and embodiments set forth herein are non-limiting, and modifications to structure, dimensions, materials, and methodologies may be made without departing from the scope of the present teachings. Other embodiments in accordance with the present disclosure will be apparent to those skilled in the art from consideration of the specification and practice of the invention disclosed herein. It is intended that the specification and examples be considered as exemplary only, with the following claims being entitled to their fullest breadth, including equivalents, under the applicable law.

What is claimed is:

1. A system, comprising:
   a printing system comprising a printhead assembly arranged to dispense a material for deposition onto a substrate;
   a substrate support apparatus having a support surface, the substrate support apparatus comprising a plurality of first passages arranged in the support surface to distribute flows of a first gas to establish a gas bearing to float the substrate above the support surface;
   a conveyance system comprising a plurality of second passages arranged in the support surface between the first passages to distribute flows of a second gas relative to the support surface so as to convey the substrate along the support surface; and
   a track disposed along the floatation table and a gripper system mounted on the track and movable along the track, the gripper system comprising a gripping device configured to grip the substrate.

2. The system of claim 1, wherein the second passages of the conveyance system are integral with the support surface of the substrate support apparatus.

3. The system of claim 1, wherein the support surface comprises a plurality of segments separated from one another by one or more gaps, and the second passages of the conveyance system comprise a plurality of nozzles disposed in the one or more gaps between the segments.

4. The system of claim 1, wherein the first passages are arranged to distribute the flows of the first gas in a direction perpendicular to the support surface and the second passages are arranged to distribute the flows of the second gas in a direction forming an acute angle relative to the support surface.

5. The system of claim 1, wherein the plurality of first passages comprises a plurality of first nozzles to distribute the flows of the first gas, and the plurality of second passages comprises a plurality of second nozzles to distribute the flows of the second gas.

6. The system of claim 5, wherein the first nozzles are arranged to distribute the flows of the first gas in a direction perpendicular to the support surface, and the second nozzles are arranged to distribute the flows of the second gas in a direction forming an acute angle relative to the support surface.

7. The system of claim 5, wherein the second nozzles are disposed at a non-peripheral region of the floatation table.

8. The system of claim 1, wherein the plurality of second passages comprises a plurality of nozzles, the nozzles configured to distribute the flows of the second gas in a direction forming an acute angle relative to the support surface.

9. The system of claim 1, wherein the plurality of first passages comprises a plurality of nozzles to distribute the flows of the first gas to float the substrate, wherein the second passages are angled relative to the support surface so as to distribute the flows of the second gas in a direction forming an acute angle relative to the support surface.

10. The system of claim 1, wherein the plurality of first passages comprises a plurality of first nozzles, and wherein the plurality of second passages comprises a plurality of second nozzles, each of the first nozzles and the second nozzles having a nozzle head that is pivotable relative to the support surface and rotatable relative to an axis of the nozzle head normal to the support surface.

11. The system of claim 10, further comprising one or more controllers each configured to adjust at least one of a pivoting angle and a rotating angle of the nozzle head.

12. The system of claim 11, further comprising one or more motors, wherein each of the first nozzles and the second nozzles is coupled to the one or more motors, and wherein the one or more motors are controllable by the one or more controllers to adjust at least one of the pivoting angle and the rotating angle of the nozzle head.

13. The system of claim 11, wherein the one or more controllers are configured to adjust the first nozzles to distribute the flows of the first gas in a direction perpendicular to the support surface, and to adjust the second nozzles to distribute the flows of the second gas in a direction forming an acute angle relative to the support surface.

14. The system of claim 1, further comprising first valves operably coupled to the first passages and second valves operably coupled to the second gas flow passages, wherein the first valves and the second valves are coupled to one or more controllers and are independently controlled by the one or more controllers to adjust at least one of pressures and flow rates of the first gas and the second gas.

15. The system of claim 1, wherein the substrate support apparatus comprises a porous medium, and the first passages comprise pores of the porous medium.

16. The system of claim 15, wherein the second passages are channels, throughholes, nozzles, or a combination thereof.

17. The system of claim 1, further comprising at least one controller configured to control the flows of the second gas to provide pulses of the second gas to translate the substrate.

18. The system of claim 1, wherein the gripper system is configured to move along the track while gripping the substrate to transport the substrate along the substrate support apparatus to a printing zone having the printing system.

19. The system of claim 18, wherein the printing system comprises an inkjet printer having at least one inkjet printhead configured to print an organic material.

20. The system of claim 1, further comprising a plurality of stoppers disposed adjacent the gripper system, wherein the second passages are configured to distribute the flows of the second gas to move the substrate toward and against the stoppers, and wherein the gripper system is configured to grip the substrate at a peripheral region of the substrate after the substrate is stopped by the stoppers.

* * * * *